(12) United States Patent
Matsumoto et al.

(10) Patent No.: US 12,027,347 B2
(45) Date of Patent: Jul. 2, 2024

(54) PLASMA PROCESSING APPARATUS AND HIGH-FREQUENCY POWER APPLICATION METHOD OF PLASMA PROCESSING APPARATUS

(71) Applicant: TOKYO ELECTRON LIMITED, Tokyo (JP)

(72) Inventors: Naoki Matsumoto, Miyagi (JP); Masaru Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 61 days.

(21) Appl. No.: 17/470,657

(22) Filed: Sep. 9, 2021

(65) Prior Publication Data

US 2022/0076928 A1 Mar. 10, 2022

(30) Foreign Application Priority Data

Sep. 9, 2020 (JP) .................................. 2020-151637

(51) Int. Cl.
*H01J 37/32* (2006.01)

(52) U.S. Cl.
CPC .. *H01J 37/32577* (2013.01); *H01J 37/32091* (2013.01); *H01J 37/32724* (2013.01)

(58) Field of Classification Search
CPC ........... H01J 37/32091; H01J 37/32146; H01J 37/32174; H01J 37/32577; H01J 37/32724

See application file for complete search history.

(56) References Cited

U.S. PATENT DOCUMENTS

| | | | | |
|---|---|---|---|---|
| 10,504,697 | B2* | 12/2019 | Baek | C23C 16/4401 |
| 2002/0086546 | A1* | 7/2002 | Yamashita | H01L 21/6833 438/710 |
| 2005/0031796 | A1* | 2/2005 | Wu | H01J 37/32174 118/715 |
| 2005/0061445 | A1* | 3/2005 | Koshiishi | H01J 37/32082 156/345.47 |
| 2005/0241762 | A1* | 11/2005 | Paterson | H01J 37/32146 156/345.28 |
| 2008/0023443 | A1* | 1/2008 | Paterson | H01J 37/32091 216/67 |
| 2010/0015357 | A1* | 1/2010 | Hanawa | H01J 37/32091 118/723 I |
| 2013/0337657 | A1* | 12/2013 | Savas | H01L 21/0217 118/723 MP |
| 2019/0109576 | A1* | 4/2019 | Long | G01S 13/00 |
| 2019/0385907 | A1* | 12/2019 | Gottheim | H01L 21/02274 |
| 2021/0050182 | A1* | 2/2021 | Kang | H01L 21/02 |

FOREIGN PATENT DOCUMENTS

| | | |
|---|---|---|
| JP | 2000-331996 A | 11/2000 |
| JP | 2007-266231 A | 10/2007 |
| WO | 2012/035842 A1 | 3/2012 |

* cited by examiner

*Primary Examiner* — Tung X Le
(74) *Attorney, Agent, or Firm* — XSENSUS LLP

(57) ABSTRACT

A plasma processing apparatus includes a vacuum-exhaustible processing container, an electrode installed in the processing container, a plurality of power feeding portions connected to a peripheral portion of a back surface of the electrode, a high-frequency power supply configured to supply high-frequency power to the electrode through the plurality of power feeding portions, and a control unit. The control unit is configured to control the plasma processing apparatus to periodically apply the high-frequency power to each of the plurality of power feeding portions.

18 Claims, 24 Drawing Sheets

PLASMA PROCESSING APPARATUS AND HIGH-FREQUENCY POWER APPLICATION METHOD OF PLASMA PROCESSING APPARATUS

CROSS-REFERENCE TO RELATED APPLICATIONS

This application claims priority to Japanese Patent Application No. 2020-151637, filed on Sep. 9, 2020, the entire contents of which are incorporated herein by reference.

TECHNICAL FIELD

The present disclosure relates to a plasma processing apparatus and a high-frequency power application method of the plasma processing apparatus.

BACKGROUND

As a plasma processing apparatus, for example, a capacitively-coupled plasma processing apparatus is known. In the capacitively-coupled plasma processing apparatus, for example, a pair of parallel flat plate electrodes (an upper electrode and a lower electrode) are arranged in a chamber, and plasma of a processing gas is formed by introducing the processing gas into the chamber, and simultaneously, applying a high frequency to one electrode. Here, when a frequency of the high frequency applied to the electrode is increased to increase plasma density, a standing wave is easily generated on a surface of the electrode due to harmonics. When the standing wave is generated, an electric field distribution on the surface of the electrode becomes uneven, and plasma generation distribution also becomes uneven. Accordingly, it has been proposed to make the plasma generation distribution uniform by installing a power supply rod for applying a high frequency to the electrode and a conductive member to a side opposite to the electrode to ground the electrode. In addition, it has been proposed to control the plasma generation distribution by dividing the power supply rod on the surface of the electrode into a central portion and a plurality of outer peripheral portions and distributing the supply of high-frequency power (see Japanese Patent Application Publication Nos. 2000-331996 and 2007-266231).

SUMMARY

The present disclosure provides a plasma processing apparatus capable of generating plasma with high in-plane uniformity, and a high-frequency power application method of the plasma processing apparatus.

One aspect of the present disclosure provides a plasma processing apparatus including a vacuum-exhaustible processing container, an electrode installed in the processing container, a plurality of power feeding portions connected to a peripheral portion of a back surface of the electrode, a high-frequency power supply configured to supply high-frequency power to the electrode through the plurality of power feeding portions and a control unit. The control unit is configured to control the plasma processing apparatus to periodically apply the high-frequency power to each of the plurality of power feeding portions.

DETAILED DESCRIPTION

Hereinafter, embodiments of the disclosed plasma processing apparatus and a high-frequency power application method of the plasma processing apparatus will be described in detail with reference to the drawings. In addition, the disclosed technology is not limited by the following embodiments.

In recent years, in order to cope with further miniaturization, a plasma processing apparatus has been required to supply high-frequency power at a higher frequency (e.g., about 100 MHz). When the frequency is higher, an electric-field intensity distribution in an electrode is increased. For example, there may be cases in which plasma density is high and electric field strength is high at a central portion of the electrode, and the plasma density is low and the electric field strength is low at an outer peripheral portion of the electrode. Due to this, the effect of uniformity or the like in plasma processing is increased. Accordingly, it is expected to generate plasma with high in-plane uniformity.

[Configuration of Plasma Processing Apparatus 1]

Figure 1:
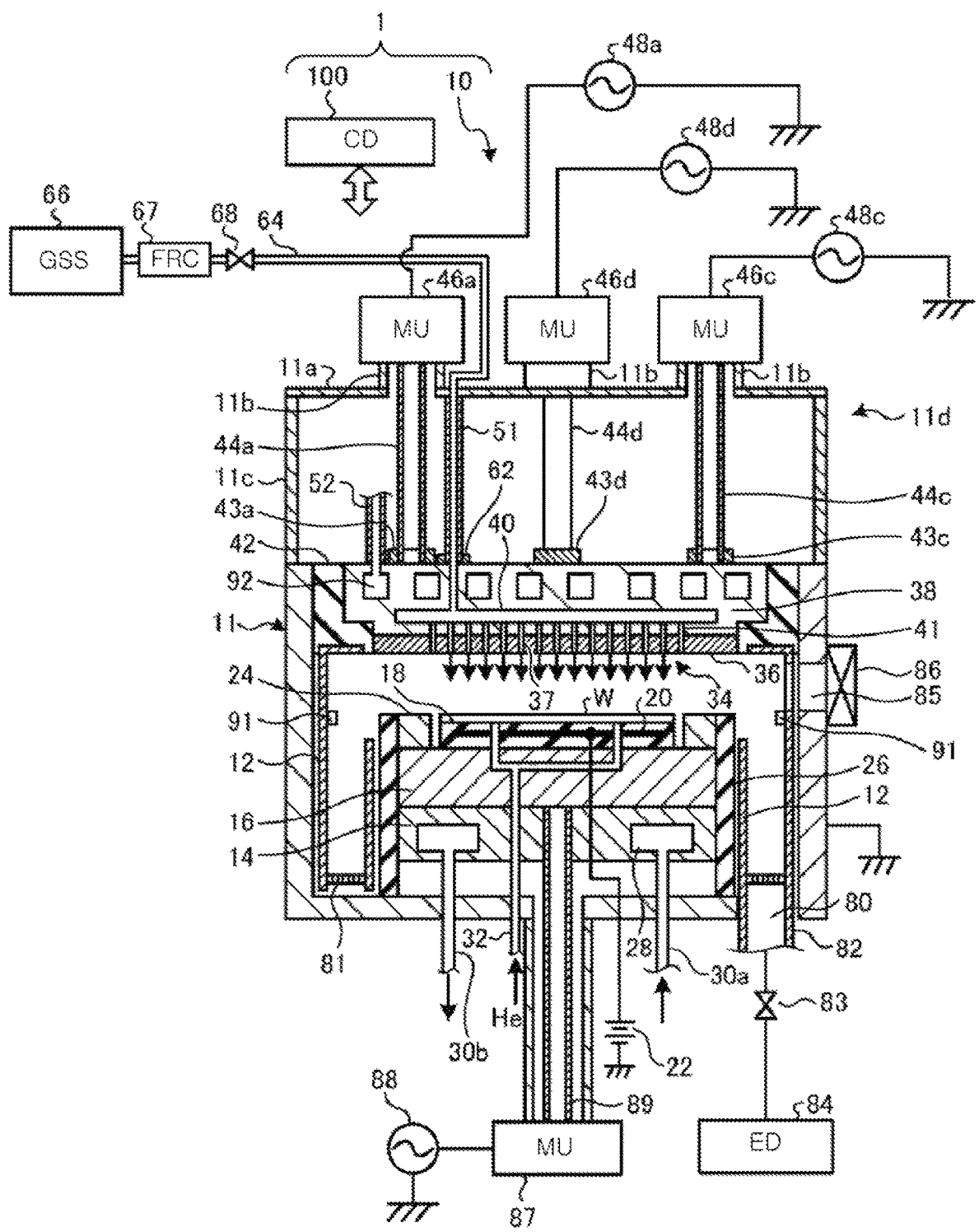
FIG. 1 is a view illustrating an example of a plasma processing apparatus according to an embodiment of the present disclosure.

FIG. 1 is a view illustrating an example of a plasma processing apparatus according to an embodiment of the present disclosure. A plasma processing apparatus 1 is an apparatus configured to perform plasma processing such as etching or film deposition on a semiconductor wafer (hereinafter referred to as a wafer) that is an example of an object to be processed. The plasma processing apparatus 1 includes an apparatus body 10 and a control device (CD) 100. The plasma processing apparatus 1 is disposed in a clean room in which the temperature and humidity of air are controlled to predetermined ranges.

The apparatus body 10 includes, for example, a chamber 11 having a substantially cylindrical shape and made of aluminum or the like whose surface is anodized. The chamber 11 is securely grounded. A columnar support 14 is disposed on a bottom portion of the chamber 11 through a cylindrical support member 26 made of quartz or the like, and a mounting table 16 made of, for example, aluminum is installed on the support 14. The mounting table 16 also serves as a lower electrode.

An electrostatic chuck 18 configured to adsorb and hold a wafer W thereon by an electrostatic force is installed on an upper surface of the mounting table 16. The electrostatic chuck 18 has a structure in which an electrode 20 made of a conductive film is sandwiched between a pair of insulating layers or insulating sheets. A DC power supply 22 is electrically connected to the electrode 20. The wafer W is adsorbed and held on an upper surface of the electrostatic chuck 18 by an electrostatic force such as a Coulomb force that is generated on the upper surface of the electrostatic chuck 18 by a DC voltage applied from the DC power supply 22.

In the periphery of the electrostatic chuck 18, a conductive edge ring 24 made of, for example, silicon is disposed at the position of the upper surface of the mounting table 16 to improve etching uniformity. The support member 26 is disposed on side surfaces of the mounting table 16 and the support 14.

A flow path 28 is installed inside the support 14, and a refrigerant from a chiller unit, which is installed outside the chamber 11, is supplied into the flow path 28 through a pipe 30a. In addition, the refrigerant supplied into the flow path 28 returns to the chiller unit through a pipe 30b. The chiller unit controls a temperature of the refrigerant supplied into the flow path 28. A temperature of the support 14 is controlled by circulating the temperature-controlled refrigerant in the flow path 28 and a temperature of the wafer W on the electrostatic chuck 18 is controlled through the mounting table 16 and the electrostatic chuck 18 on the support 14.

A pipe 32 is installed in the support 14, the mounting table 16, and the electrostatic chuck 18. A heat transfer gas, which is supplied to the pipe 32 from a heat transfer gas supply mechanism (not shown), is supplied between the wafer W and the electrostatic chuck 18 through the pipe 32. The heat transfer gas is, for example, a helium gas. By controlling a pressure of the heat transfer gas supplied between the wafer W and the electrostatic chuck 18, a heat transfer rate between the wafer W and the electrostatic chuck 18 may be controlled.

A shower head 34 is installed above the mounting table 16 to face the mounting table 16 substantially in parallel thereto. The shower head 34 also serves as an upper electrode. That is, the shower head 34 and the mounting table 16 serve as a pair of electrodes (an upper electrode and a lower electrode, or a first electrode and a second electrode). A space between the shower head 34 and the mounting table 16 is a plasma generating space.

The shower head 34 is supported on an upper portion of the chamber 11 through an insulating shielding member 42. The shower head 34 includes a top plate 36 disposed to face the mounting table 16, and a base member 38 configured to support the top plate 36 from above.

A plurality of discharge holes 37 passing through in a thickness direction and configured to eject a processing gas into the chamber 11 are formed in the top plate 36. The top plate 36 is formed of, for example, silicon, SiC, or the like.

The base member 38 is made of a conductive material such as aluminum whose surface is anodized, and the top plate 36 is detachably supported at a lower portion of the base member 38. A diffusion chamber 40 is formed inside the base member 38 to supply the processing gas to the plurality of discharge holes 37. A plurality of flow holes 41 are formed in a bottom portion of the base member 38 so as to be located below the diffusion chamber 40. The plurality of flow holes 41 communicate with the plurality of discharge holes 37, respectively.

An inlet 62 for introducing the processing gas into the diffusion chamber 40 is formed in the base member 38. One end of a pipe 51 is connected to the inlet 62. One end of a pipe 64 is connected to the other end of the pipe 51 through an inlet installed in a plate-shaped member 11a. A gas supply source (GSS) 66 configured to supply the processing gas is connected to the other end of the pipe 64. In the pipe 64, a flow rate controller (FRC) 67 and a valve 68 are installed sequentially from the upstream side. In addition, the flow rate controller 67 is a flow control system (FCS) or a mass flow controller (MFC). When plasma processing is performed on the wafer W on the electrostatic chuck 18, the processing gas supplied from the gas supply source 66 is supplied into the diffusion chamber 40 through the pipe 64 and the pipe 51, and diffused into the diffusion chamber 40. The processing gas diffused into the diffusion chamber 40 is supplied in a shower form into the chamber 11 through the flow holes 41 and the discharge holes 37.

A flow path 92 is installed inside the base member 38, and a refrigerant is supplied into the flow path 92 from a chiller unit (not shown), which is installed outside the chamber 11, through a pipe (not shown) and a pipe 52. One end of the pipe 52 is connected to the flow path 92. A pipe (not shown) is connected to the other end of the pipe 52 through the inlet installed in the plate-shaped member 11a. In addition, in FIG. 1, the part from the middle of the pipe 52 to the chiller unit is omitted. In addition, the pipe 52 may be made of materials having the same or a similar dielectric constant, and may be made of, for example, a fluorocarbon resin such as poly phenylene sulfide (PPS) or poly tetra fluoro ethylene (PTFE).

The refrigerant supplied into the flow path 92 of the base member 38 from the chiller unit (not shown) through the pipe 52 circulates through the flow path 92 and is returned to the chiller unit through the pipe 52. The chiller unit controls the temperature of the refrigerant supplied into the flow path 92. The chiller unit is an example of a temperature control unit. By circulating the temperature-controlled refrigerant in the flow path 92, a temperature rise of the shower head 34 due to heat, which is input from the plasma generated between the mounting table 16 and the shower head 34, is suppressed.

The temperature of the refrigerant circulating in the flow path 92 is a temperature lower than a dew point temperature of exterior air of the chamber 11. In the present embodiment, the temperature of the refrigerant is, for example, a temperature of 0° C. or less. The base member 38 in which the flow path 92 is formed is an example of a cooling unit.

Further, on the base member 38, radio frequency (RF) introduction units 43a to 43d are installed, and high-frequency power supplies 48a to 48d are electrically connected through power feeding portions 44a to 44d and matching units (MU) 46a to 46d, respectively. The power feeding portions 44a to 44d are arranged at the same interval on a circumference of the same radius from a center of the base member 38. In addition, in the following description, when the power feeding portions 44a to 44d are not distinguished, the power feeding portions 44a to 44d are expressed as power feeding portions 44. Also, the RF introduction unit 43b, the power feeding portion 44b, the matching unit 46b, and the high-frequency power supply 48b are located on the front side of a cross section of FIG. 1 and thus are not shown in FIG. 1. In the present embodiment, the power feeding portions 44a to 44d are hollow cylindrical members made of a conductive metal such as aluminum. The high-frequency power supplies 48a to 48d are power supplies for plasma generation, and each generates a frequency of 13.56 MHz or higher, for example, high-frequency power of 60 MHz to 100 MHz (hereinafter, also referred to as RF power). The high-frequency powers generated by the high-frequency power supplies 48a to 48d are supplied to the base member 38 respectively through the matching units 46a to 46d and the power feeding portions 44a to 44d. Although not shown in the drawing, in the base member 38, regions respectively corresponding to the power feeding portions 44a to 44d are insulated from each other. The matching units 46a to 46d respectively match internal (or output) impedances of high-frequency power supplies 48a to 48d to load impedance. The matching units 46a to 46d serve to apparently match the output impedance of each of the high-frequency power supplies 48a to 48d to the load impedance when plasma is generated in the chamber 11. Output terminals of the matching units 46a to 46d are electrically connected to upper ends of the power feeding portions 44a to 44d, respectively.

The shower head 34 and the power feeding portions 44a to 44d are covered with a substantially cylindrical cover member 11d installed above a side wall of the chamber 11. The cover member 11d is made of a conductive material such as aluminum and is grounded through the chamber 11. Thus, leakage of the high-frequency power, which is supplied to the shower head 34, to the outside of the apparatus body 10 is suppressed. The cover member 11d includes a plate-shaped member 11a, cylindrical-shaped members lib, and a wall member 11c. The plate-shaped member 11a is a top wall portion of the cover member 11d and installed so as to be substantially parallel to the shower head 34. The cylindrical-shaped members lib cover peripheries of the power feeding portions 44a to 44d and connect the plate-shaped member 11a and the matching units 46a to 46d, respectively. The wall member 11c connects an upper end of the side wall of the chamber 11 to the plate-shaped member 11a. The plate-shaped member 11a is provided with an inlet via a connection between the pipe 51 and the pipe 64. In addition, although not shown in the drawing, the plate-shaped member 11a is provided with an inlet via a connection between the pipe 52 and the pipe to the chiller unit. The power feeding portions 44a to 44d connect the matching units 46a to 46d to the base member 38 through central portions of the cylindrical-shaped members lib, respectively. In addition, a space covered by the cover member 11d is under atmospheric pressure.

A high-frequency power supply 88 is electrically connected to the mounting table 16, which serves as a lower electrode, through a power feeding portion 89 and a matching unit (MU) 87. The high-frequency power supply 88 is a power supply for ion attraction (bias), and supplies a frequency in the range of 300 kHz to 13.56 MHz, for example, high-frequency power of 2 MHz to the mounting table 16. The matching unit 87 matches an internal (or output) impedance of the high-frequency power supply 88 to load impedance. The matching unit 87 serves to apparently match the internal impedance of the high-frequency power supply 88 to the load impedance when plasma is generated in the chamber 11.

An exhaust port 80 is installed on the bottom portion of the chamber 11. An exhaust device (ED) 84 is connected to the exhaust port 80 through an exhaust pipe 82 and an auto pressure control (APC) valve 83. The exhaust device 84 includes a vacuum pump such as a turbo molecular pump, and an interior of the chamber 11 may be depressurized to a desired degree of vacuum. The APC valve 83 adjusts the pressure in the chamber 11.

An opening 85 for carrying in and out the wafer W is installed in the side wall of the chamber 11, and the opening 85 is opened and closed by a gate valve 86. A depo shield 12 is detachably installed on an inner sidewall of the chamber 11 to prevent etching by-products (depo) from adhering to the chamber 11. The depo shield 12 is also installed on an outer circumference of the support member 26. On the bottom portion of the chamber 11, an exhaust plate 81 is installed between the depo shield 12 on the side of the side wall of the chamber 11 and the depo shield 12 on the side of the support member 26. As the depo shield 12 and the exhaust plate 81, an aluminum material coated with a ceramic such as $Y_2O_3$ may be suitably used.

A GND block 91 made of a conductive member and connected to the ground in a DC manner is installed at a position of the depo shield 12, at almost the same height as the wafer W, disposed along an inner wall of the chamber 11. An abnormal discharge in the chamber 11 is prevented by the GND block 91.

The operation of the apparatus body 10 configured as described above is collectively controlled by the control device 100. The control device 100 includes a processor, a memory, and an input/output interface. A program, a processing recipe, and the like are stored in the memory. The processor controls each unit of the apparatus body 10 though the input/output interface according to the processing recipe read from the memory by executing the program read from the memory.

When processing using plasma is performed on the wafer W in the plasma processing apparatus 1 configured in this manner, the control device 100 performs, for example, the following control for each unit of the plasma processing apparatus 1. First, in a state in which the wafer W is placed on the electrostatic chuck 18, the control device 100 controls the flow rate controller 67 and the valve 68 to supply a processing gas of a predetermined flow rate into the diffusion chamber 40. The processing gas supplied into the diffusion chamber 40 is diffused in the diffusion chamber 40 and supplied in a shower form into the chamber 11 through the plurality of flow holes 41 and the discharge holes 37. In addition, the control device 100 controls the APC valve 83 and the exhaust device 84 such that the interior of the chamber 11 is controlled to a predetermined pressure.

In addition, the control device 100 generates high-frequency power of a predetermined frequency used for generating plasma in the high-frequency power supplies 48a to 48d, and supplies the generated high-frequency power to the shower head 34 through the power feeding portions 44a to 44d. Thus, the processing gas in the chamber 11 is converted into plasma. The control device 100 causes the high-frequency power supply 88 to generate high-frequency power of a predetermined frequency, which is used for ion attraction (bias), and supplies the high-frequency power to the mounting table 16. Thus, charged particles such as ions in the plasma are attracted into the wafer W on the electrostatic chuck 18. As a result, predetermined plasma processing such as etching is performed on the wafer W on the electrostatic chuck 18.

[Connection of Power Feeding Portion to Electrode]

Figure 2:
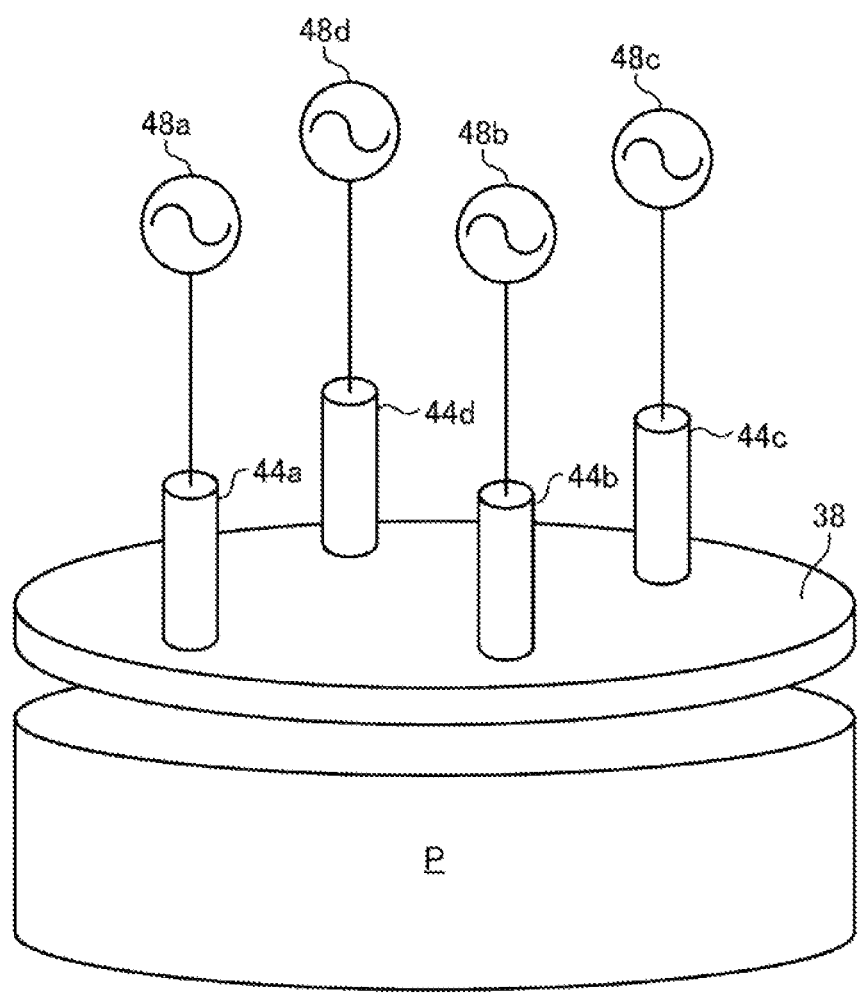
FIG. 2 is a view illustrating an example of a connection of a high-frequency power supply and a power feeding portion to an upper electrode.

FIG. 2 is a view illustrating an example of a connection of the high-frequency power supply and the power feeding portion to the upper electrode. FIG. 2 illustrates a perspective view of the connection of the power feeding portions 44a to 44d to the base member 38 of the shower head 34, which is the upper electrode. The power feeding portions 44a to 44d are arranged at the same interval on the circumference of the same radius from the center of the base member 38. In addition, the high-frequency power supplies 48a to 48d are connected to the power feeding portions 44a to 44d, respectively. In addition, the matching units 46a to 46d are omitted. Although not shown in the drawing, in the base member 38, regions respectively corresponding to the power feeding portions 44a to 44d are insulated from each other.

The high-frequency power supplies 48a to 48d periodically apply RF power (high-frequency power) to the power feeding portions 44a to 44d. That is, the high-frequency power supplies 48a to 48d are pulse power supplies capable of intermittently outputting RF power. In this case, for example, when RF power is applied to the power feeding portion 44c, a voltage immediately below the power feeding portion 44a of the shower head 34 increases, and a current flowing into plasma P increases. The high-frequency power supplies 48a to 48d may average the density of the plasma P by applying RF power to the power feeding portions 44a to 44d, for example, in an adjacent order in a predetermined circumferential direction.

Figure 3:
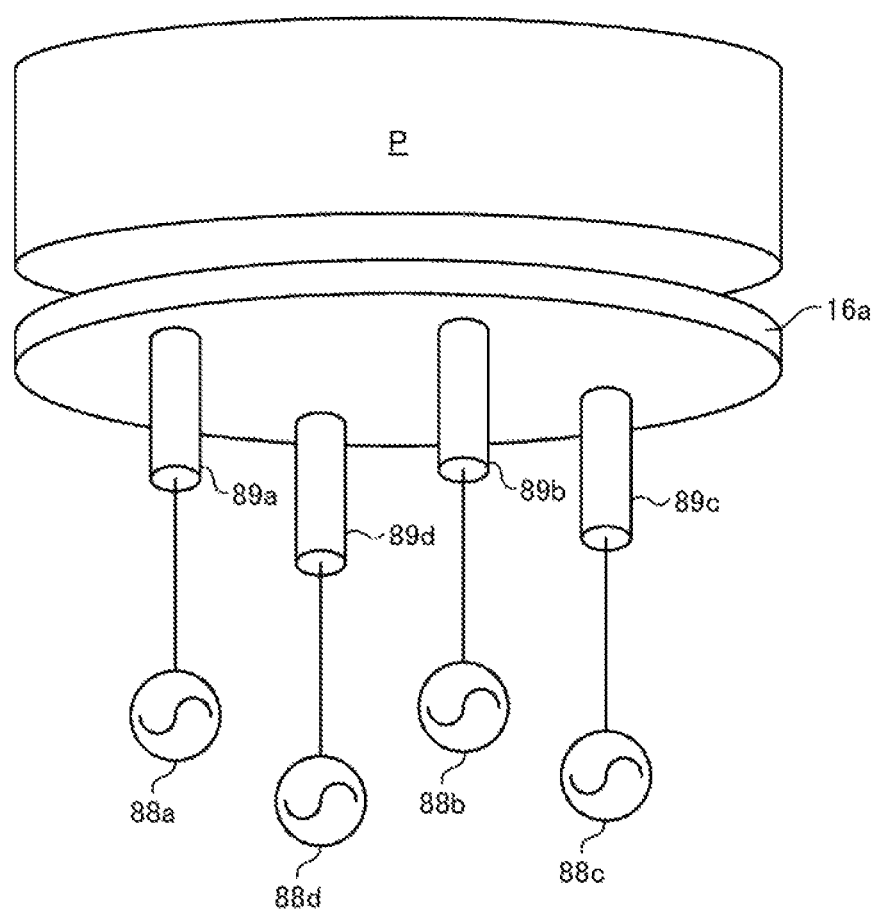
FIG. 3 is a view illustrating an example of a connection of the high-frequency power supply and the power feeding portion to a lower electrode.

FIG. 3 is a view illustrating an example of a connection of the high-frequency power supply and the power feeding portion to a lower electrode. FIG. 3 illustrates a connection of a plurality of power feeding portions 89 to the mounting table 16 that is the lower electrode. FIG. 3 is a perspective view illustrating the connection of power feeding portions 89a to 89d to a mounting table 16a. The power feeding portions 89a to 89d are arranged at the same interval on a circumference of the same radius from a center of the mounting table 16a in the same manner as in the case of the upper electrode. In addition, high-frequency power supplies 88a to 88d are connected to the power feeding portions 89a to 89d, respectively. In addition, the matching unit is omitted. Further, although not shown in the drawing, in the mounting table 16a, regions respectively corresponding to the power feeding portions 89a to 89d are insulated from each other. As in the case of the upper electrode, the high-frequency power supplies 88a to 88d may average the density of the plasma P by periodically applying RF power to the power feeding portions 89a to 89d.

[Comparison with Case of Feeding Power to Central Portion of Electrode]

Figure 4:
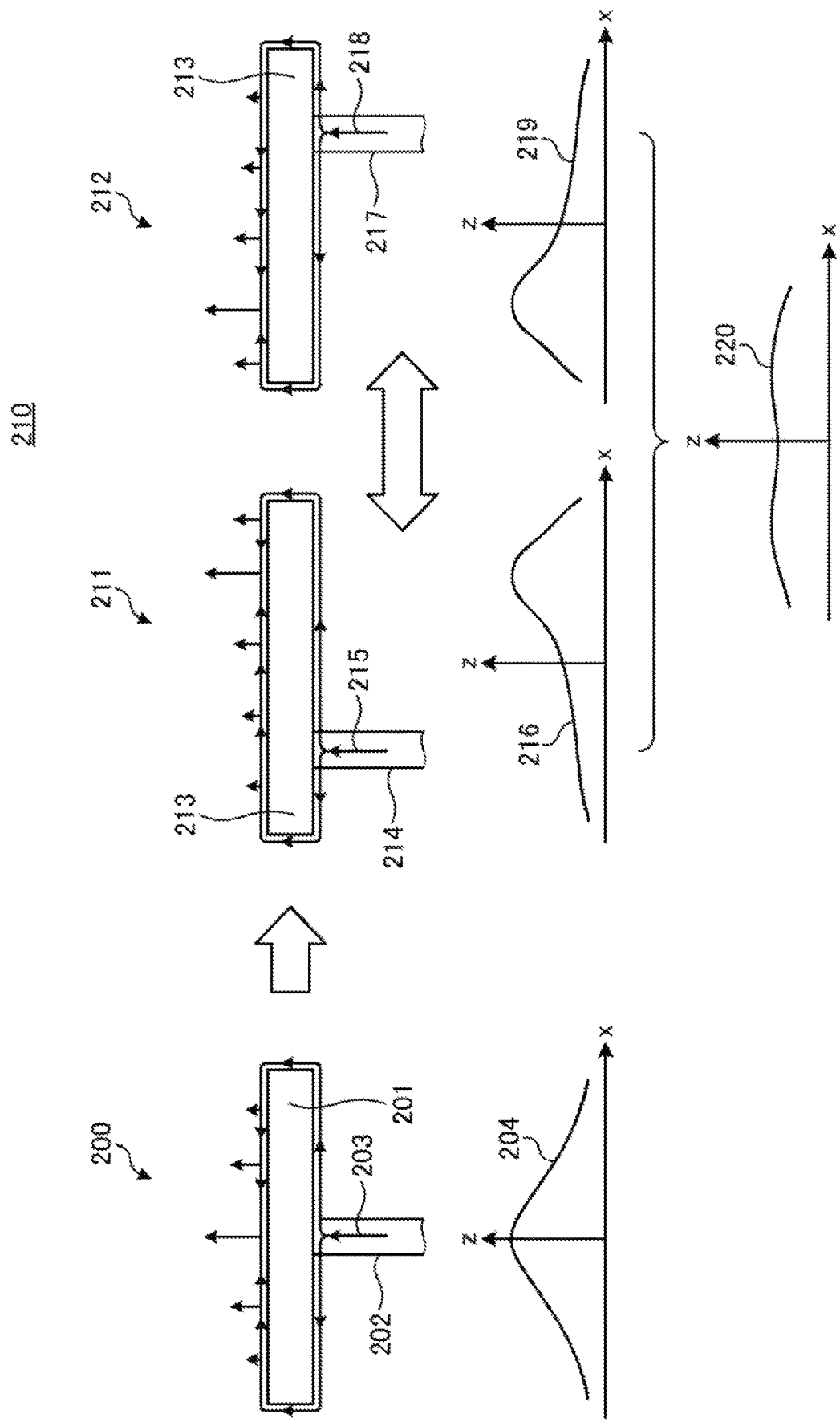
FIG. 4 is a view illustrating an example of a voltage distribution in a case of feeding power to a central portion of an electrode and a case of feeding pulse power to an outer peripheral portion of the electrode.

FIG. 4 is a view illustrating an example of a voltage distribution in a case of feeding power to a central portion of an electrode and a case of feeding pulse power to an outer peripheral portion of the electrode. Further, in the following description, the description is given with the upper electrode inverted. In central power feeding 200 of FIG. 4, RF power 203 is supplied by a power feeding portion 202 connected to a central portion of an upper electrode 201. In this case, as shown in graph 204, a voltage distribution of the upper electrode 201 is high at the central portion of the upper electrode 201 and low at an outer peripheral portion thereof.

On the other hand, in outer peripheral portion pulse power feeding 210, state 211 and state 212 are alternately repeated. In addition, in FIG. 4, for convenience of description, a case in which two power feeding portions are located on a straight line is illustrated. In the case of state 211, RF power 215 is supplied by a power feeding portion 214 connected to an outer peripheral portion of an upper electrode 213 on a left side in the drawing. In this case, as shown in graph 216, a voltage distribution of the upper electrode 213 is high at an outer peripheral portion on a side opposite to the power feeding portion 214 and low at an outer peripheral portion on a side directly above the power feeding portion 214. Meanwhile, in the case of state 212, RF power 218 is supplied by a power feeding portion 217 connected to an outer peripheral portion of the upper electrode 213 on a right side in the drawing. In this case, as shown in graph 219, a voltage distribution of the upper electrode 213 is high at an outer peripheral portion on a side opposite to the power feeding portion 217 and low at an outer peripheral portion on a side directly above the power feeding portion 217. Since state 211 and state 212 are alternately repeated in outer peripheral portion pulse power feeding 210, graph 216 and graph 219 are averaged over time, and the voltage distribution in the upper electrode 213 is shown in graph 220. It can be seen that, in graph 220, the uniformity of the voltage distribution is improved as compared with that in graph 204 of the case of central power feeding 200.

[Voltage Distribution in One Power Feeding Portion]

Figure 5:
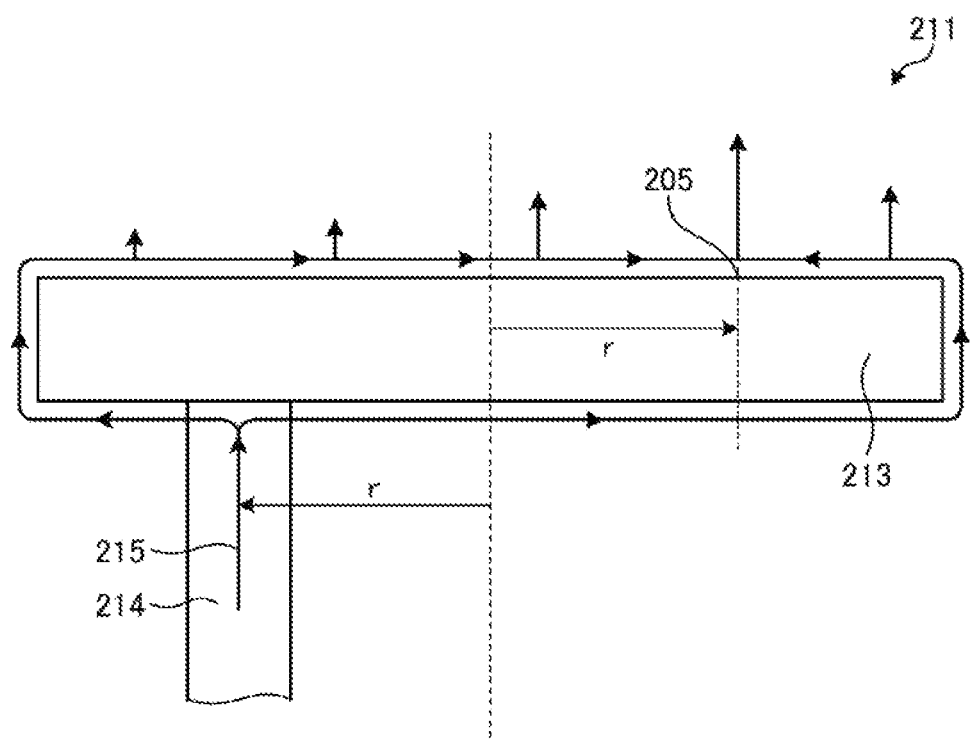
FIG. 5 is a cross-sectional view illustrating an example of the relationship between a position of the power feeding portion on the electrode and a position at which voltage is maximum.

FIG. 5 is a cross-sectional view illustrating an example of the relationship between a position of the power feeding portion on the electrode and a position at which voltage is maximum. In the upper electrode 213 in state 211 shown in FIG. 5, on a circumference of a radius r, a point 205 is located on a surface of the upper electrode 213 at the opposite side of the power feeding portion 214, at which the voltage is maximum, that is, a size of an arrow indicating the magnitude of the current flowing into plasma is maximum. That is, the voltage at the point 205, which is equidistant from the power feeding portion 214 along the surface of the upper electrode 213, is the maximum.

Figure 6:
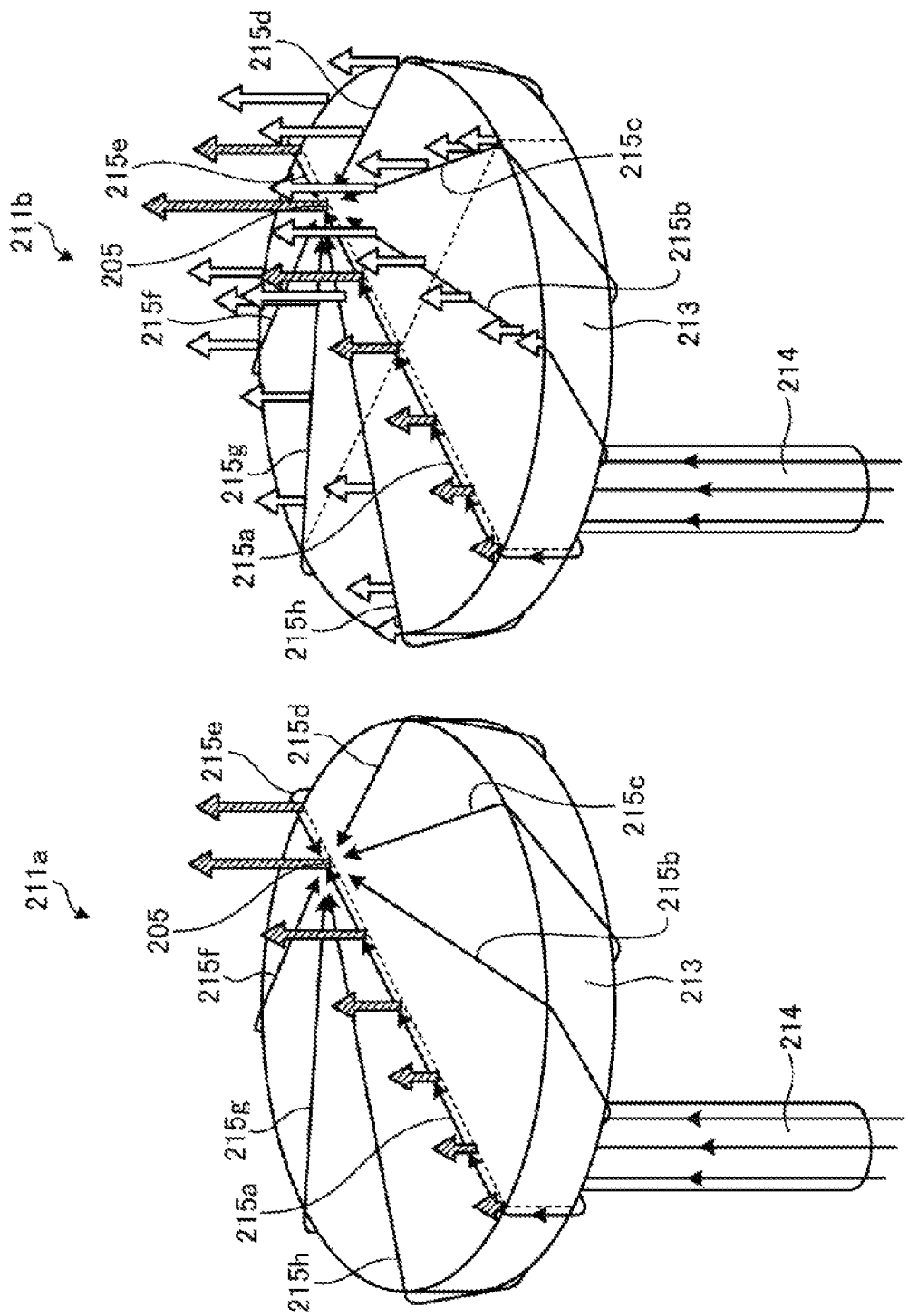
FIG. 6 is a perspective view illustrating an example of the relationship between a position of the power feeding portion on the electrode and a position at which voltage is maximum.

FIG. 6 is a perspective view illustrating an example of the relationship between a position of the power feeding portion on the electrode and a position at which voltage is maximum. FIG. 6 illustrates arrows indicating magnitudes of the current flowing into plasma on paths 215a to 215h of the RF power, when the upper electrode 213 in state 211 is viewed obliquely. In state 211a, only arrows on paths 215a and 215e connecting the power feeding portion 214 and the point 205 at the shortest distance are extracted and illustrated. In state 211b, in order to confirm the voltage distribution in the upper electrode 213, a circumference of the upper electrode 213 is divided at approximately equal intervals indicated by arrows on the paths 215a to 215h. As shown in FIG. 6, it can be seen that, on the surface of the upper electrode 213, the arrow indicating the magnitude of the current flowing into the plasma, that is, the highest voltage, is at the point 205.

Figure 7:
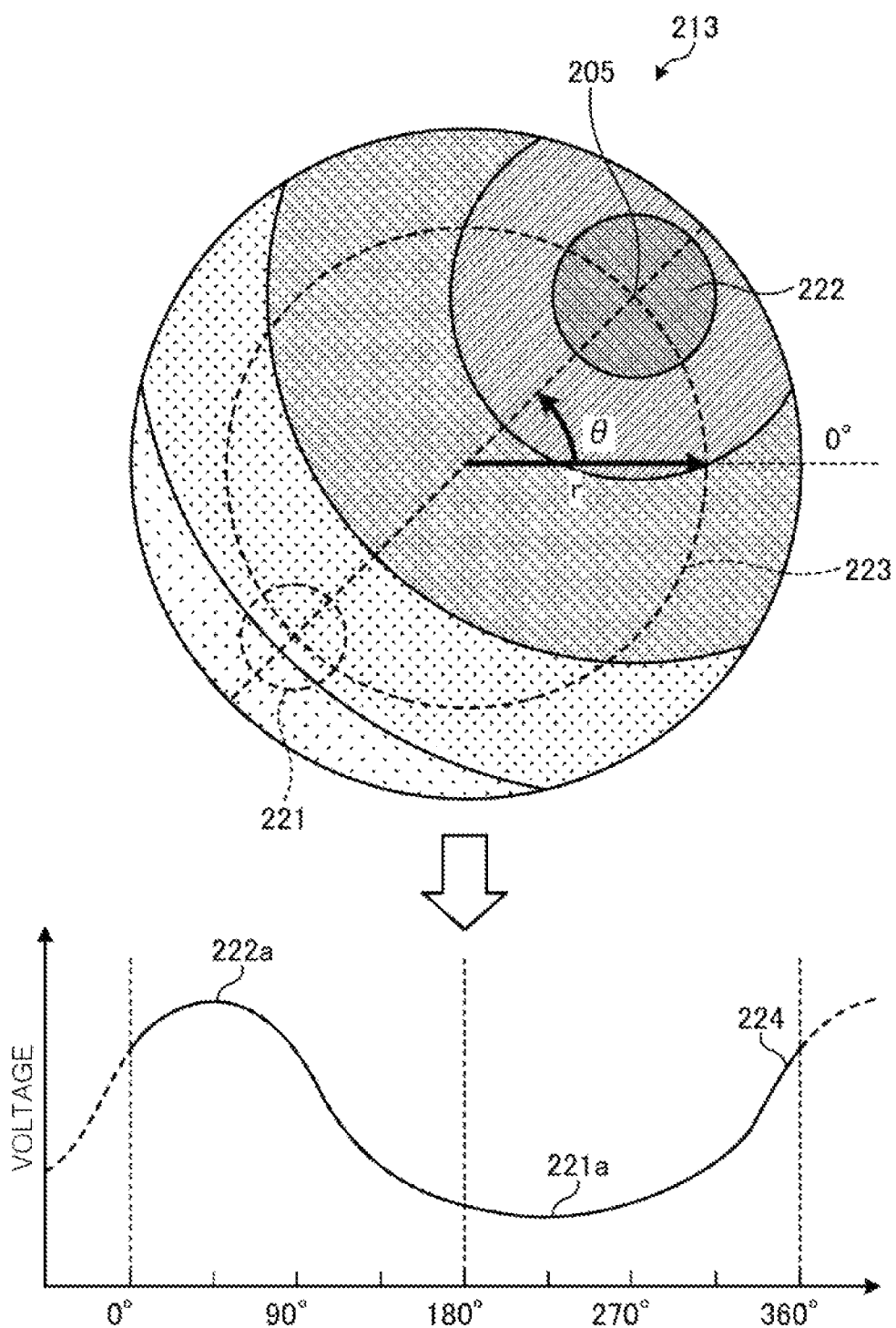
FIG. 7 illustrates a top view illustrating an example of the relationship between a position of the power feeding portion on the electrode and a position at which voltage is maximum, and a graph illustrating a voltage distribution on a circumference at which the power feeding portion is located.

FIG. 7 is a top view illustrating an example of the relationship between a position of the power feeding portion on the electrode and a position at which voltage is maximum, and a graph illustrating a voltage distribution on a circumference at which the power feeding portion is located. As shown in the top view of FIG. 7, in the upper electrode 213, positions of a region 221, in which the power feeding portion 214 is projected, and a region 222, which includes the point 205, are on a circumference 223 of a radius r. In addition, the voltage distribution has a concentric circle shape centered on the region 222. In this case, graph 224 is obtained by plotting the voltage distribution on the circumference 223 for one circumference in a 0 direction. As shown in graph 224, the voltage at the circumference 223 is minimized in a section 221a corresponding to the region 221 and maximized in a section 222a corresponding to the region 222.

[Phase Shift Pulse Power Feeding]

Figure 8:
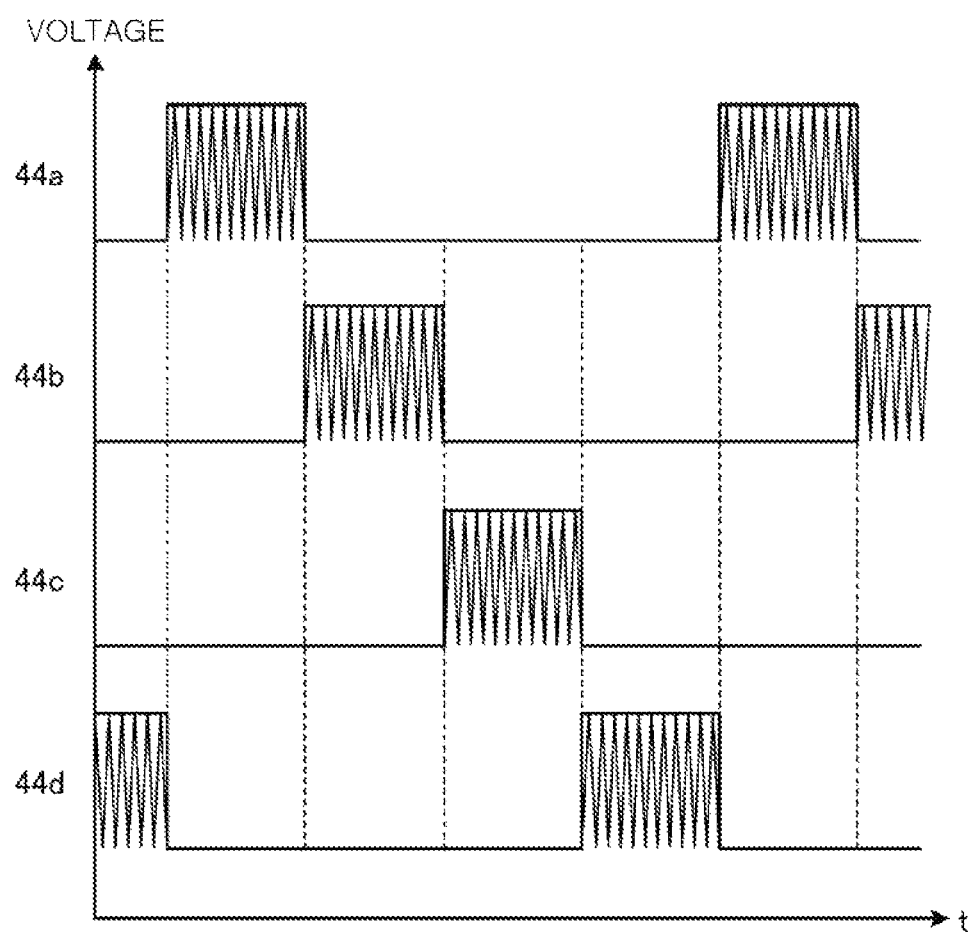
FIG. 8 is a view illustrating an example of an application timing in pulse power feeding.
Figure 9:
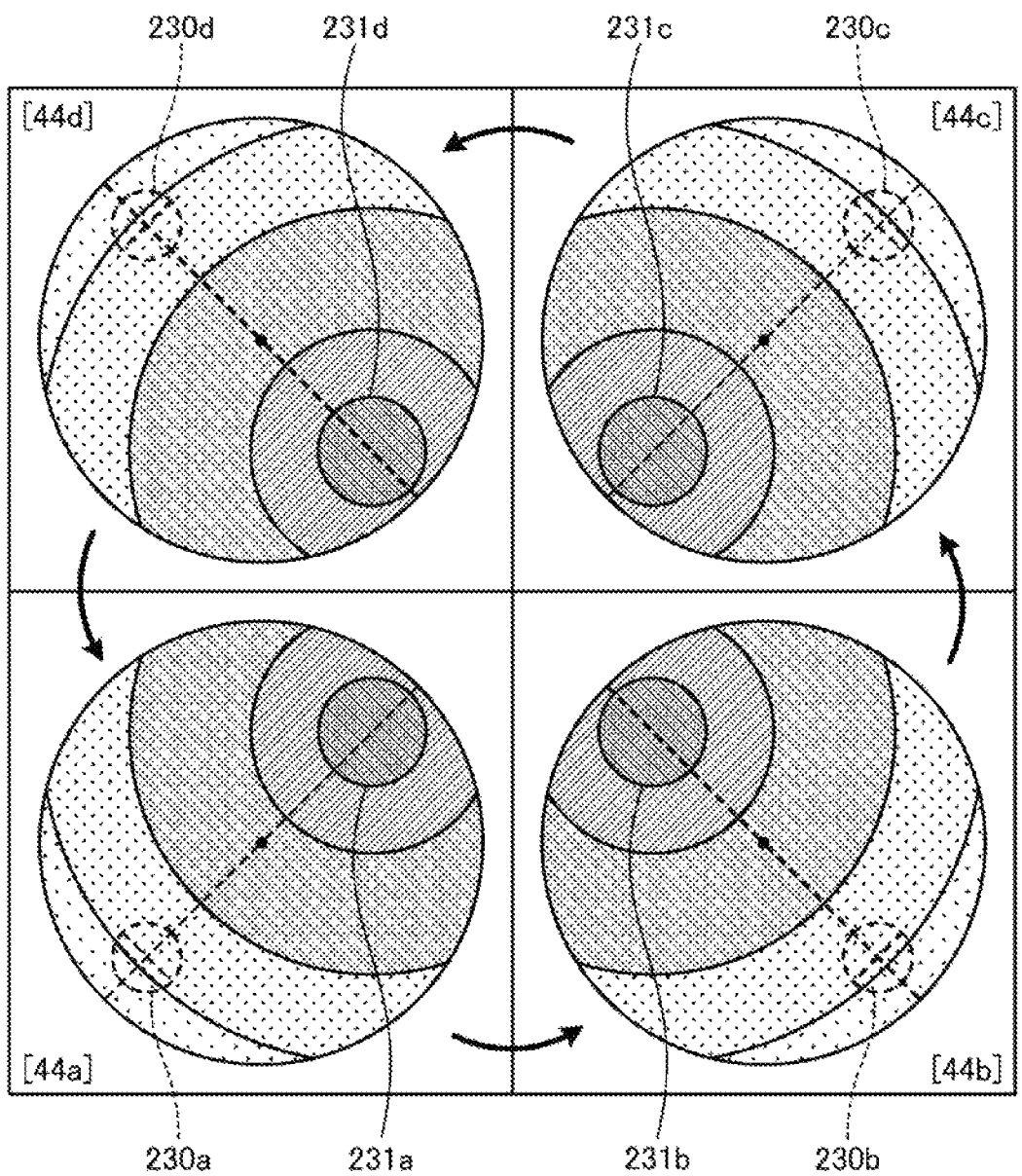
FIG. 9 is a view illustrating an example of a transition of a position at which voltage of the electrode is maximized at the application timing in FIG. 8.

FIG. 8 is a view illustrating an example of an application timing in pulse power feeding. FIG. 9 is a view illustrating an example of a transition of a position at which voltage of the electrode is maximized at the application timing in FIG. 8. As shown in FIG. 8, in the present embodiment, a timing of applying a pulse of RF power to the power feeding portions 44a to 44d is shifted. In the example of FIG. 8, the timing of applying the pulse of RF power is sequentially shifted as if drawing a circle in a circumferential direction from the power feeding portion 44a, for example, in an adjacent order of the power feeding portion 44b, the power feeding portion 44c, the power feeding portion 44d, the power feeding portion 44a, and the like. Then, as shown in FIG. 9, a state in which the voltage distribution is maximized is sequentially repeated in regions 231a to 231d that are sides opposite to projected positions 230a to 230d of the power feeding portions 44a to 44d with a center of a circumference of a radius r interposed therebetween. That is, an antinode portion of a standing wave is sequentially positioned in the order of the regions 231a to 231d, and biased plasma is generated. The biased plasma is rotated similarly by the rotation of the antinode portion of the standing wave in response to a phase change of the pulse. Further, by changing a frequency of the pulse, a rotational frequency of the biased plasma may be controlled. That is, a process of an arbitrary distribution may be formed by controlling rotation plasma through a phase change, pulse input parameters, or the like.

Figure 10:
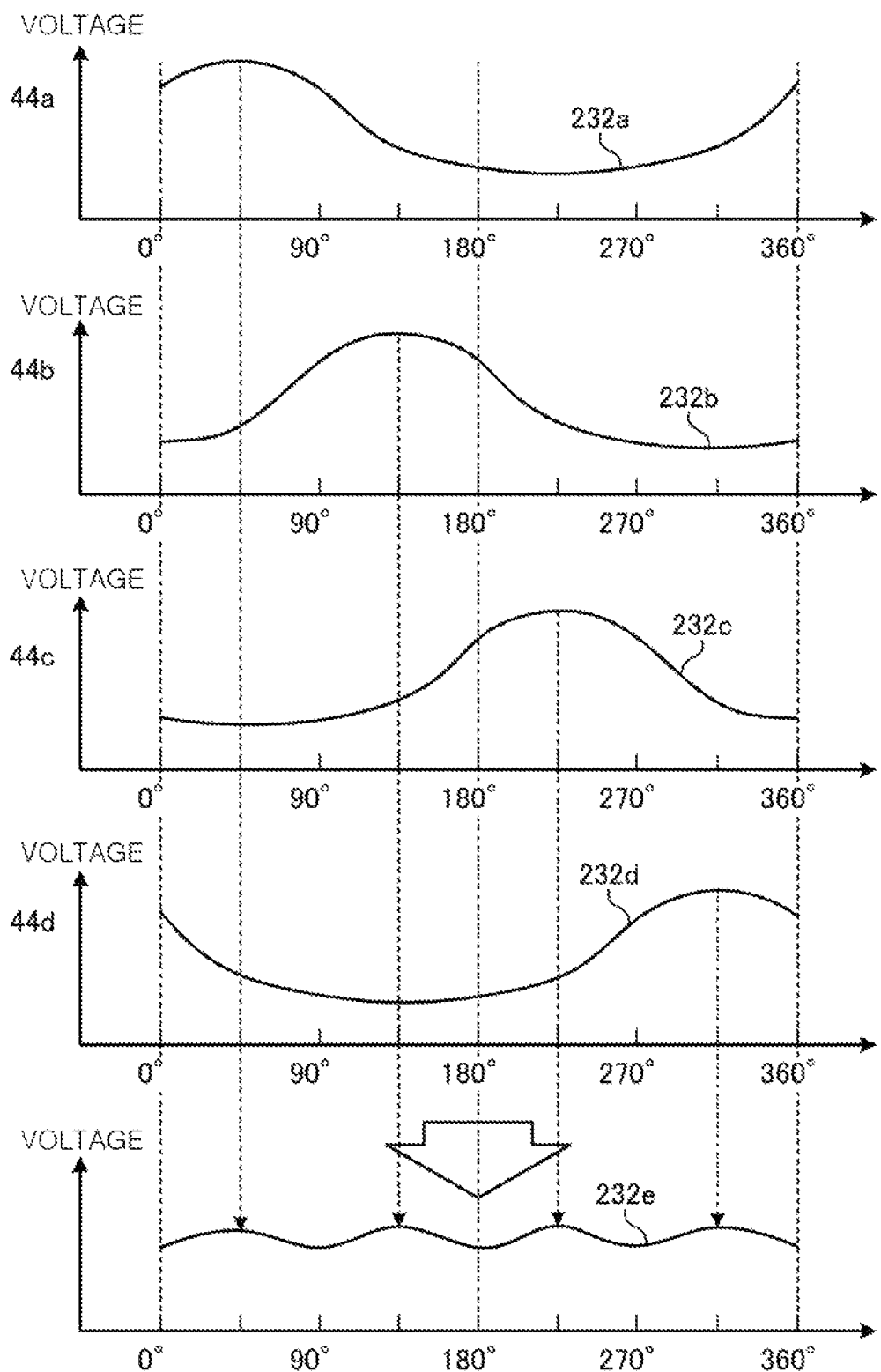
FIG. 10 is a set of graphs illustrating a voltage distribution on a circumference, on which each power feeding portion is located, at the application timing of FIG. 8.

FIG. 10 is a set of graphs illustrating the voltage distribution on the circumference, on which each power feeding portion is located, at the application timing of FIG. 8. The voltage distribution on the circumference of a radius r in a case in which RF power is applied to each of the power feeding portions 44a to 44d is shown in each of graphs 232a to 232d of FIG. 10. When the pulse of the RF power is applied to the power feeding portions 44a to 44d at the timing shown in FIG. 8, the pulses of RF power are averaged over time to obtain the voltage distribution having a high uniformity as shown in graph 232e. Further, by increasing the number of power feeding portions, the uniformity may be further improved.

Further, for example, when there is a period in which the timing at which the high-frequency power is applied to the power feeding portion 44a overlaps the timing at which the high-frequency power is applied to the power feeding portion 44b, a standing wave from the power feeding portion 44a and a standing wave from the power feeding portion 44b interfere with each other, and thus interference fringes may appear in the voltage distribution on the surface of the upper electrode 213, which may affect the uniformity. Accordingly, as shown in FIG. 8 described above, it is desirable that the timing of applying the high-frequency power to the power feeding portions 44a to 44d is exclusive as well as periodic.

However, it is expected that, depending on a size of the upper electrode 213 and a mutual distance between the projected positions 230a to 230d of the power feeding portions 44a to 44d, the interference fringes may be used to further improve the uniformity of the voltage distribution.

When the timing is exclusive, for example, since the application of the high-frequency power to the power feeding portion 44b is turned on after the application of the high-frequency power to the power feeding portion 44a is turned off, there is a possibility that the generation of plasma may be instantaneously unstable. Accordingly, for example, the plasma may be stabilized by providing a period in which the timing of applying the high-frequency power to the power feeding portion 44a overlaps the timing of applying the high-frequency power to the power feeding portion 44b for some time as in the case in which the application of the high-frequency power to the power feeding portion 44b is turned on before the application of the high-frequency power to the power feeding portion 44a is turned off. In addition, the application of the high-frequency power may not be the rectangular application as shown in FIG. 8, but for example, the application may be turned on/off in a stepwise or gradient manner in the period in which the timing at which the high-frequency power is applied to the power feeding portion 44a overlaps the timing at which the high-frequency power is applied to the power feeding portion 44b.

Accordingly, the timing of applying the high-frequency power is not limited to being exclusive.

[Plasma Processing Method]

Figure 11:
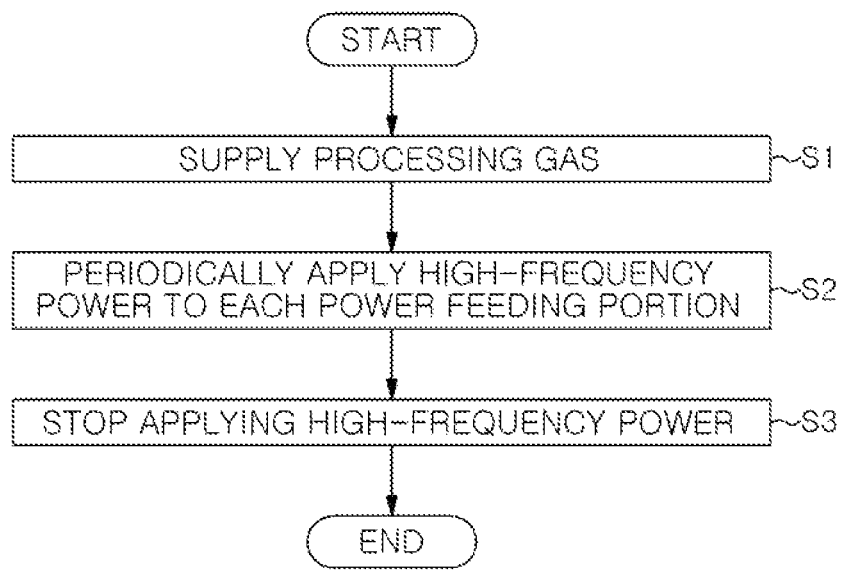
FIG. 11 is a flowchart illustrating an example of plasma processing in accordance with the present embodiment.

Next, a plasma processing method according to the present embodiment will be described. FIG. 11 is a flowchart illustrating an example of plasma processing in accordance with the present embodiment.

In the plasma processing method of the present embodiment, the control device 100 carries the wafer W into the chamber 11 by a transfer device (not shown) and places the wafer W on the electrostatic chuck 18. In a state in which the wafer W is placed on the electrostatic chuck 18, the control device 100 controls the flow rate controller 67 and the valve 68 to supply a processing gas of a predetermined flow rate into the chamber 11 through the diffusion chamber (step S1). In addition, the control device 100 controls the APC valve 83 and the exhaust device 84 such that the interior of the chamber 11 is controlled to a predetermined pressure.

The control device 100 controls the high-frequency power supplies 48a to 48d to periodically apply high-frequency power to the power feeding portions 44a to 44d, for example, like the application timing shown in FIG. 8, and supplies the high-frequency power to the shower head 34 (step S2). In addition, the control device 100 causes the high-frequency power supply 88 to generate high-frequency power for biasing and supply the high-frequency power to the mounting table 16. Thus, predetermined plasma processing such as etching is performed on the wafer W by plasma generated in the chamber 11.

When the predetermined plasma processing is completed, the control device 100 stops the supply of the high-frequency power from the high-frequency power supplies 48a to 48d and the high-frequency power supply 88 (step S3). Thereafter, the control device 100 carries the wafer W out of the interior of the chamber 11 by the transfer device (not shown) and terminates the plasma processing. Thus, in the present embodiment, high-frequency power is periodically applied to the power feeding portions 44a to 44d, so that plasma with high in-plane uniformity may be generated.

First Modified Example

Figure 12:
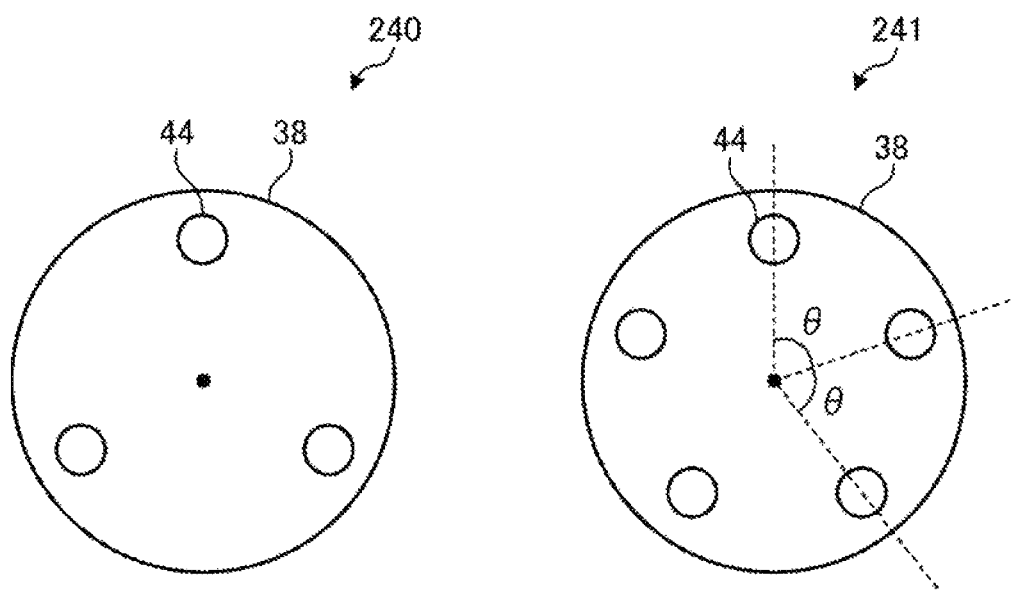
FIG. 12 is a view illustrating an arrangement example of a case in which an odd number of power feeding portions are arranged in a first modified example.

Modified examples of the arrangement of the power feeding portion 44 will now be described with reference to FIGS. 12 to 14 as a first modified example. FIG. 12 is a view illustrating an arrangement example of a case in which an odd number of power feeding portions are arranged in the first modified example. Arrangement example 240 shown in FIG. 12 is an example in which three power feeding portions 44 are arranged at equal intervals on one circumference on the base member 38. Arrangement example 241 is an example in which five power feeding portions 44 are arranged at equal intervals on one circumference on the base member 38. In addition, in arrangement example 241, one power feeding portion 44 is disposed every central angle θ. Further, as an example of the odd-number arrangement, the number is not limited as long as the number is three or more, and more power feeding portions 44, such as seven and nine power feeding portions 44, may be arranged. In addition, when an odd number of power feeding portions 44 are arranged, the power feeding portions 44 are rotationally symmetrically arranged.

Figure 13:
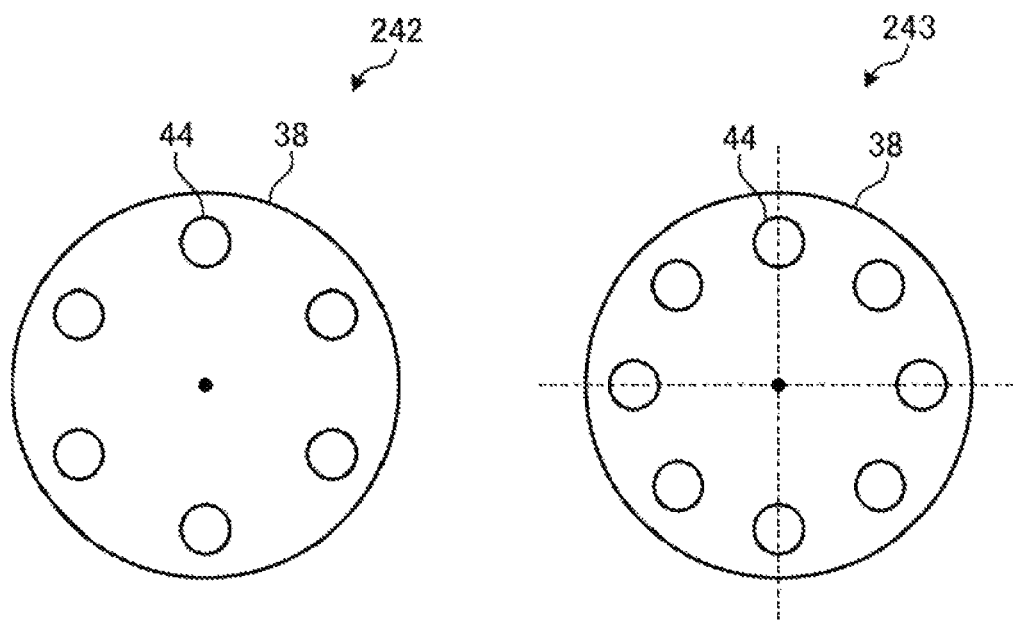
FIG. 13 is a view illustrating an arrangement example of a case in which an even number of power feeding portions are arranged in the first modified example.

FIG. 13 is a view illustrating an arrangement example of a case in which an even number of power feeding portions are arranged in the first modified example. Arrangement example 242 shown in FIG. 13 is an example in which six power feeding portions 44 are arranged at equal intervals on one circumference on the base member 38. Arrangement example 243 is an example in which eight power feeding portions 44 are arranged at equal intervals on one circumference on the base member 38. Further, as an example of the even-number arrangement, the number is not limited as long as the number is four or more, and more power feeding portions 44, such as ten and twelve power feeding portions 44, may be arranged. In addition, when an even number of power feeding portions 44 are arranged, the power feeding portions 44 are arranged axially symmetrically, and arranged rotationally symmetrically in the same manner as in the case in which odd numbers are arranged.

Figure 14:
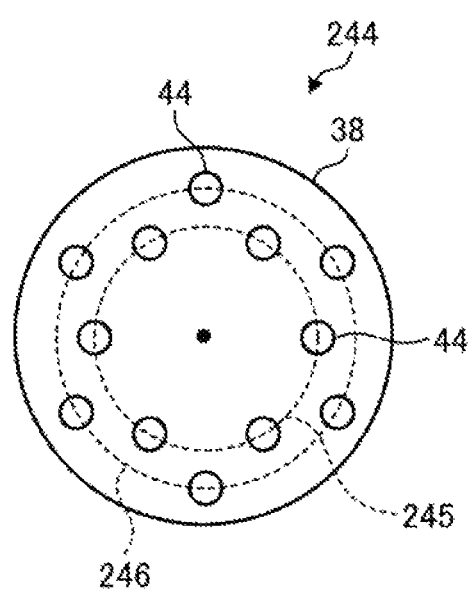
FIG. 14 is a view illustrating an arrangement example of a case in which power feeding portions are arranged on a plurality of circumferences in the first modified example.

FIG. 14 is a view illustrating an arrangement example of a case in which power feeding portions are arranged on a plurality of circumferences in the first modified example. Arrangement example 244 shown in FIG. 14 is an example in which six power feeding portions 44 are arranged at the same interval on each of two circumferences 245 and 246 on the base member 38, and the power feeding portions 44 on the circumferences 245 and 246 are arranged so as not to overlap each other in a radial direction. In this case, the power feeding portions 44 are arranged rotationally or axially symmetrically on each of the circumferences 245 and 246. Further, the number of power feeding portions 44 on the circumferences 245 and 246 is not limited as long as the number is three or more in the odd-number arrangement, and is not limited as long as the number is four or more in the even-number arrangement. In arrangement example 244, a pulse of RF power is alternately and sequentially applied to the power feeding portions 44 on the circumference 245 and the power feeding portions 44 on the circumference 246 in a circumferential direction. In arrangement example 244, for example, the pulse of RF power may be applied only to the power feeding portions 44 on the circumference 245, or may be applied only to the power feeding portions 44 on the circumference 246. Further, in FIGS. 12 to 14, the higher the number of power feeding portions 44, the more uniform the plasma may be generated in the circumferential direction of the outer peripheral portion of the electrode.

Second and Third Modified Examples

Figure 15:
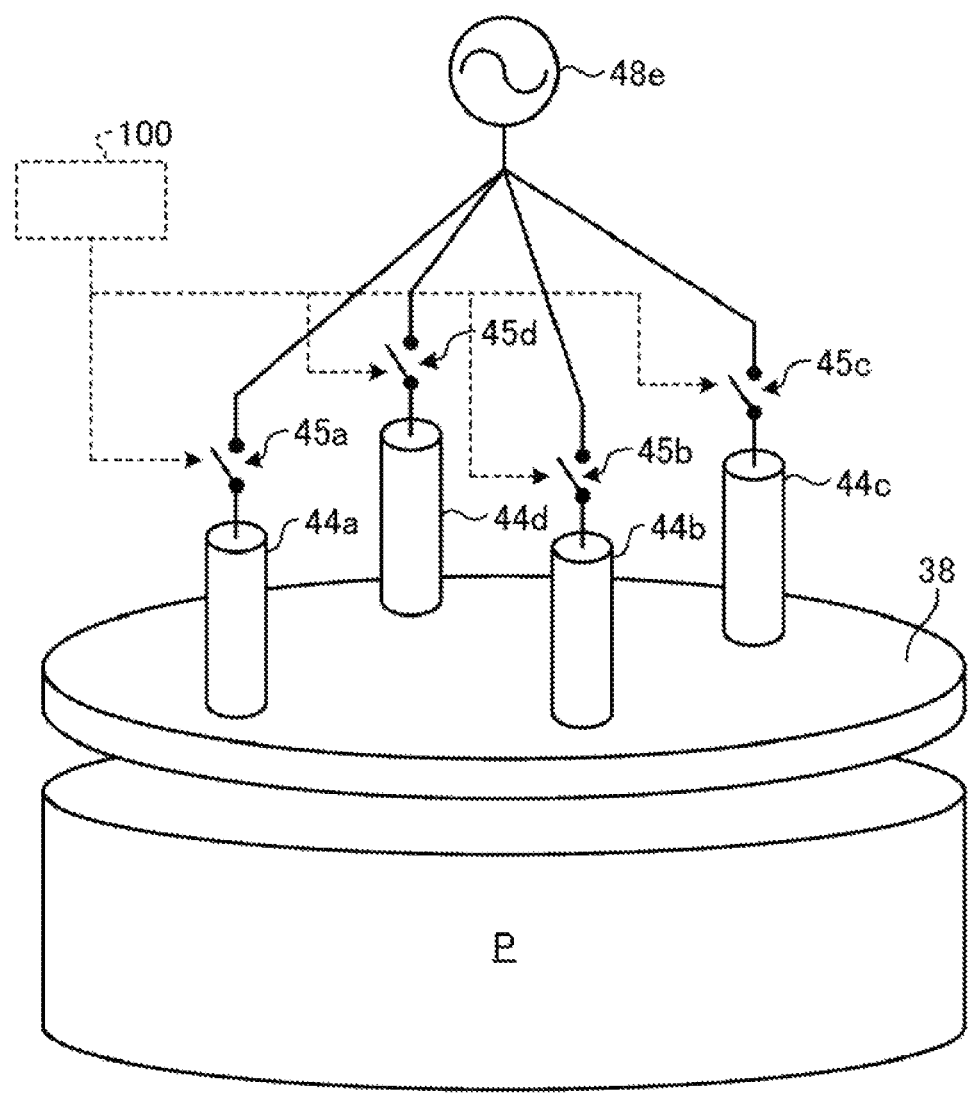
FIG. 15 is a view illustrating an example of a connection of a high-frequency power supply and a power feeding portion to an upper electrode in a second modified example.

Next, modified examples of the connection method of the high-frequency power supplies will be described as second and third modified examples. FIG. 15 is a view illustrating an example of the connection of the high-frequency power supply and the power feeding portion to the upper electrode in the second modified example. In FIG. 15, instead of the high-frequency power supplies 48a to 48d in the above embodiment, switches 45a to 45d respectively installed at the power feeding portions 44a to 44d and one high-frequency power supply 48e are provided. The high-frequency power supply 48e is connected to the switches 45a to 45d. In FIG. 15, pulse power feeding is performed by controlling the switches 45a to 45d by the control device 100. The switches 45a to 45d are, for example, RF switches such as field-effect transistor (FET) switches. The control device 100 controls the switches 45a to 45d such that high-frequency power is applied to the power feeding portions 44a to 44d at the application timing shown in FIG. 8. Thus, the number of high-frequency power supplies may be reduced.

Figure 16:
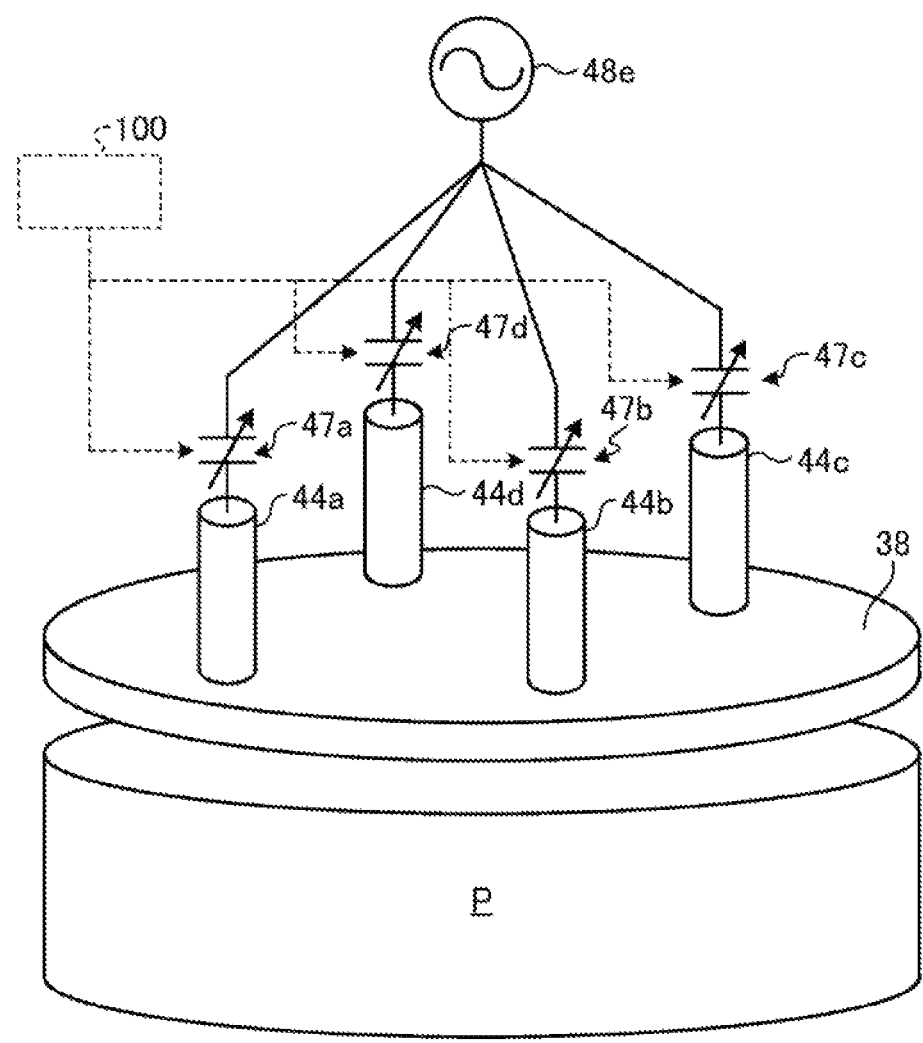
FIG. 16 is a view illustrating an example of a connection of a high-frequency power supply and a power feeding portion to an upper electrode in a third modified example.

FIG. 16 is a view illustrating an example of the connection of the high-frequency power supply and the power feeding portion to the upper electrode in the third modified example. In FIG. 16, instead of the high-frequency power supplies 48a to 48d in the above embodiment, variable capacitors 47a to 47d respectively installed at the power feeding portions 44a to 44d and one high-frequency power supply 48e are provided. The high-frequency power supply 48e is connected to the variable capacitors 47a to 47d. In FIG. 16, pulse power feeding is performed by controlling the variable capacitors 47a to 47d by the control device 100. The variable capacitors 47a to 47d are, for example, variable capacitors or the like. The control device 100 controls the variable capacitors 47a to 47d such that high-frequency power is applied to the power feeding portions 44a to 44d at the application timing shown in FIG. 8. Thus, the number of high-frequency power supplies may be reduced.

Fourth Modified Example

Figure 17:
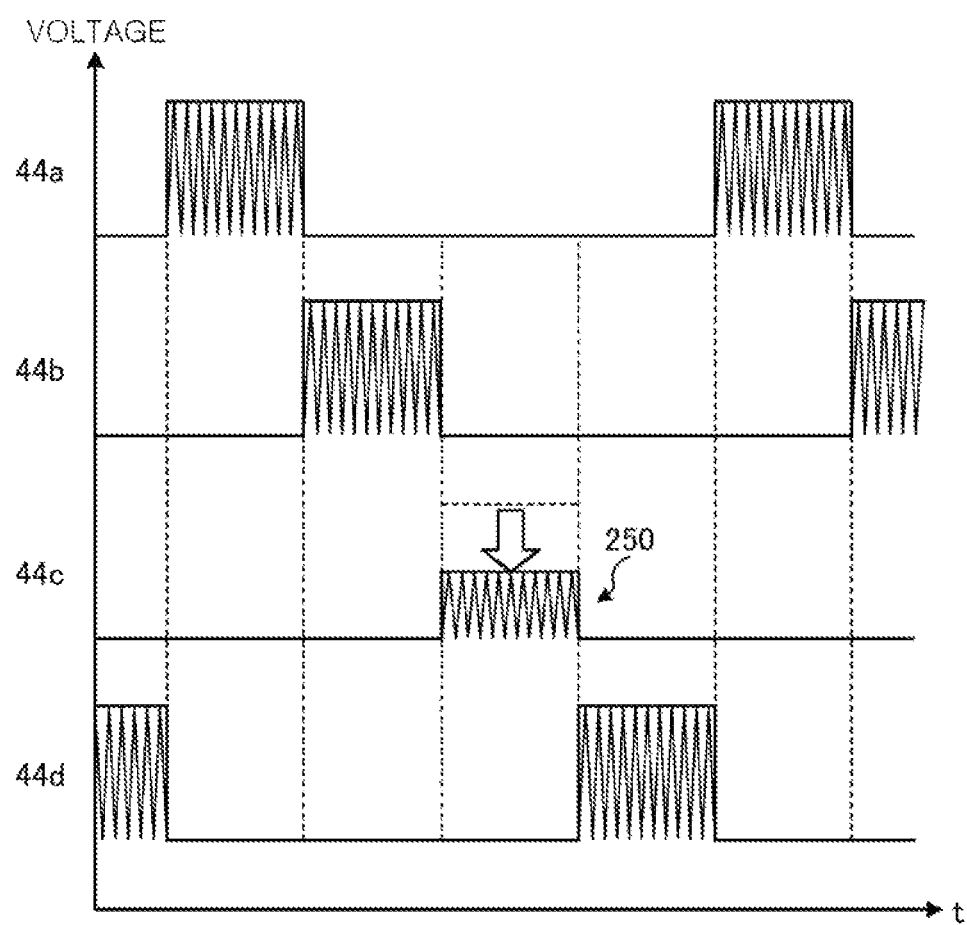
FIG. 17 is a view illustrating an example of an application timing in pulse power feeding in a fourth modified example.

Next, a fourth modified example is described in which a voltage distribution is adjusted by a waveform of pulse power feeding. FIG. 17 is a view illustrating an example of an application timing in pulse power feeding in the fourth modified example. As shown in FIG. 17, a voltage of a part of pulses of RF power applied to the power feeding portions 44a to 44d is lowered as shown in a pulse 250.

Figure 18:
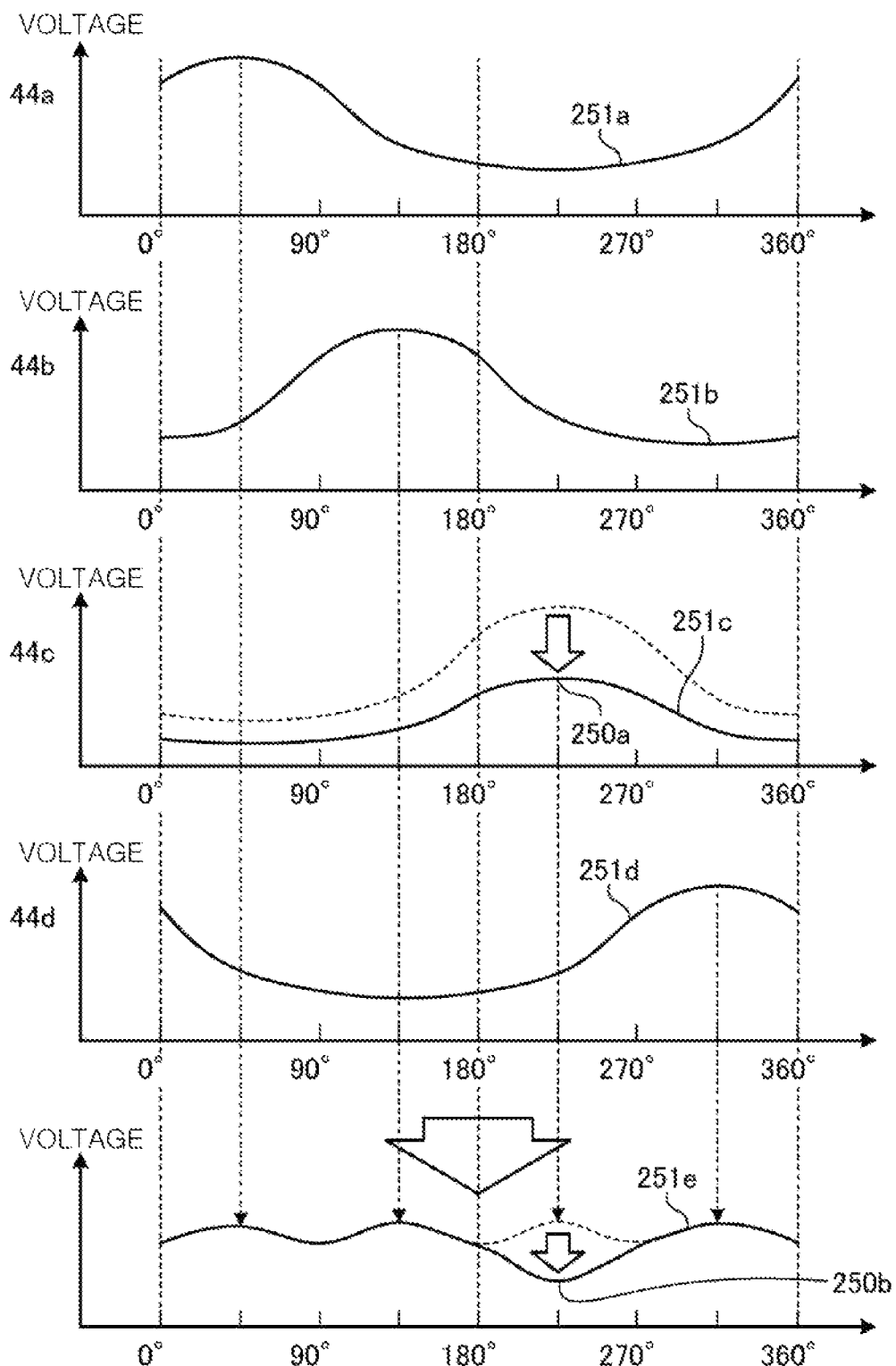
FIG. 18 is a set of graphs illustrating a voltage distribution on a circumference, on which each power feeding portion is located, at the application timing of FIG. 17.

FIG. 18 is a set of graphs illustrating a voltage distribution on a circumference, on which each power feeding portion is located, at the application timing of FIG. 17. The voltage distribution on a circumference of a radius r in a case in which RF power is applied to each of the power feeding portions 44a to 44d at the application timing of FIG. 17 is shown in each of graphs 251a to 251d of FIG. 18. In this case, a peak voltage of region 250a corresponding to the pulse 250 is lowered in graph 251c of the power feeding portion 44c. In graph 251e in which graphs 251a to 251d are averaged over time, a voltage of region 250b corresponding to the pulse 250 is lowered. That is, by changing a waveform of the pulse to be applied to the power feeding portions 44a to 44d, the uniformity of plasma in a circumferential direction may be forcibly biased in specific positions. That is, when the plasma is biased by factors other than the power feeding portion, for example, an exhaust system, an assembly error, or the like, the uniformity of the plasma may be adjusted by the waveform of the pulse.

Fifth and Sixth Modified Examples

Figure 19:
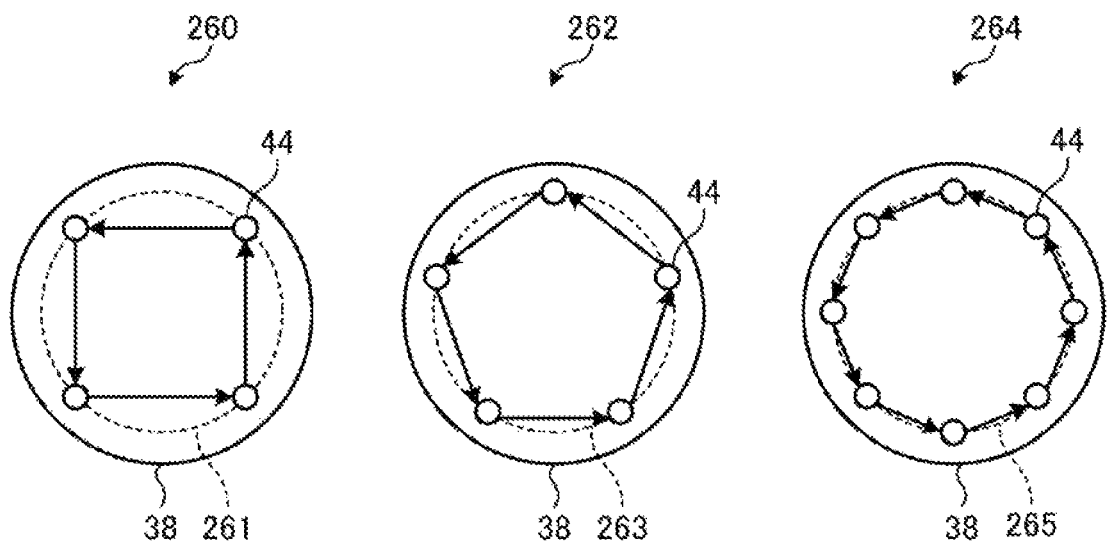
FIG. 19 is a view illustrating an example of an application order of high-frequency power to each power feeding portion in the present embodiment and a fifth modified example.

Next, an application order of RF power to the power feeding portions 44 will be described. FIG. 19 is a view illustrating an example of an application order of high-frequency power to each power feeding portion in the present embodiment and a fifth modified example. Application order 260 shown in FIG. 19 illustrates a case in which RF power is sequentially applied to four power feeding portions 44 arranged on a circumference 261 of the base member 38 as in the power feeding portions 44a to 44d of the above-described embodiment. In application order 260, RF power is applied to each of the power feeding portions 44 in an adjacent order in a predetermined circumferential direction, e.g., in a counterclockwise direction (left rotation direction) of the circumference 261.

Similarly, a case in which five and eight power feeding portions 44 are provided is described as the fifth modified example. Application order 262 illustrates a case in which RF power is sequentially applied to five power feeding portions 44 arranged on a circumference 263 of the base member 38. In application order 262, RF power is applied to each of the power feeding portions 44 in an adjacent order in a predetermined circumferential direction, e.g., in a counterclockwise direction of the circumference 263. Application order 264 illustrates a case in which RF power is sequentially applied to eight power feeding portions 44 arranged on a circumference 265 of the base member 38. In application order 264, RF power is applied to each of the power feeding portions 44 in an adjacent order in a predetermined circumferential direction, e.g., in a counterclockwise direction of the circumference 265.

Figure 20:
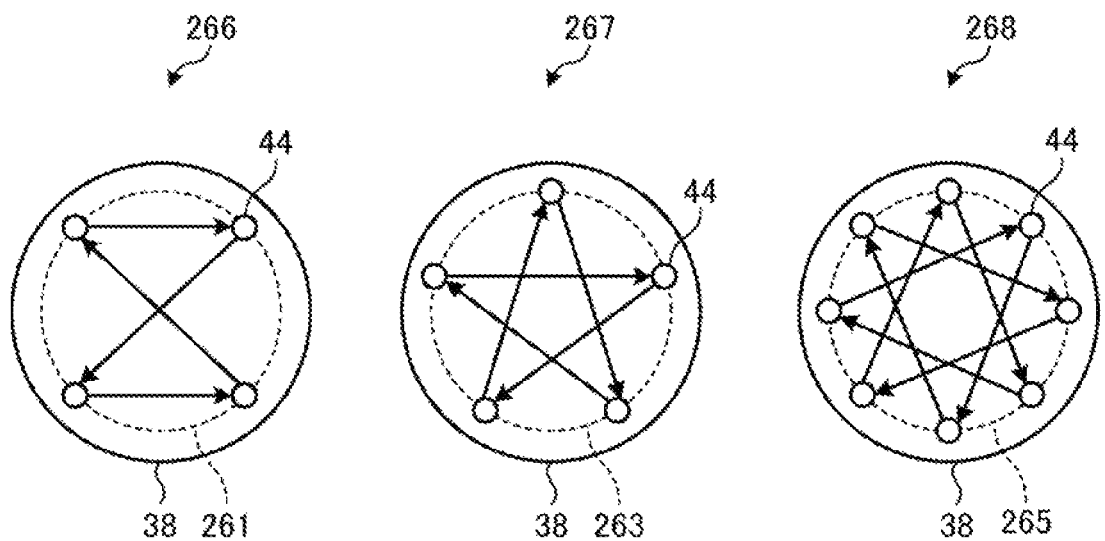
FIG. 20 is a view illustrating an example of an application order of high-frequency power to each power feeding portion in a sixth modified example.

FIG. 20 is a view illustrating an example of an application order of high-frequency power to each power feeding portion in a sixth modified example. In the sixth modified example shown in FIG. 20, a case is illustrated in which RF power is applied in the order in which diagonal lines of a polygon or diagonal lines and sides of a quadrangle with each power feeding portion 44 as a vertex are drawn in one stroke. In application order 266, the RF power is applied to four power feeding portions 44 arranged on the circumference 261 of the base member 38 in the order in which diagonal lines and sides of a quadrangle with each power feeding portion 44 as a vertex are drawn in one stroke.

In application order 267, the RF power is applied to five power feeding portions 44 arranged on the circumference 263 of the base member 38 in the order in which diagonal lines of a pentagon with each power feeding portion 44 as a vertex are drawn in one stroke. In application order 268, the RF power is applied to eight power feeding portions 44 arranged on the circumference 265 of the base member 38 in the order in which diagonal lines of an octagon with each power feeding portion 44 as a vertex are drawn in one stroke.

Seventh and Eighth Modified Examples

Figure 21:
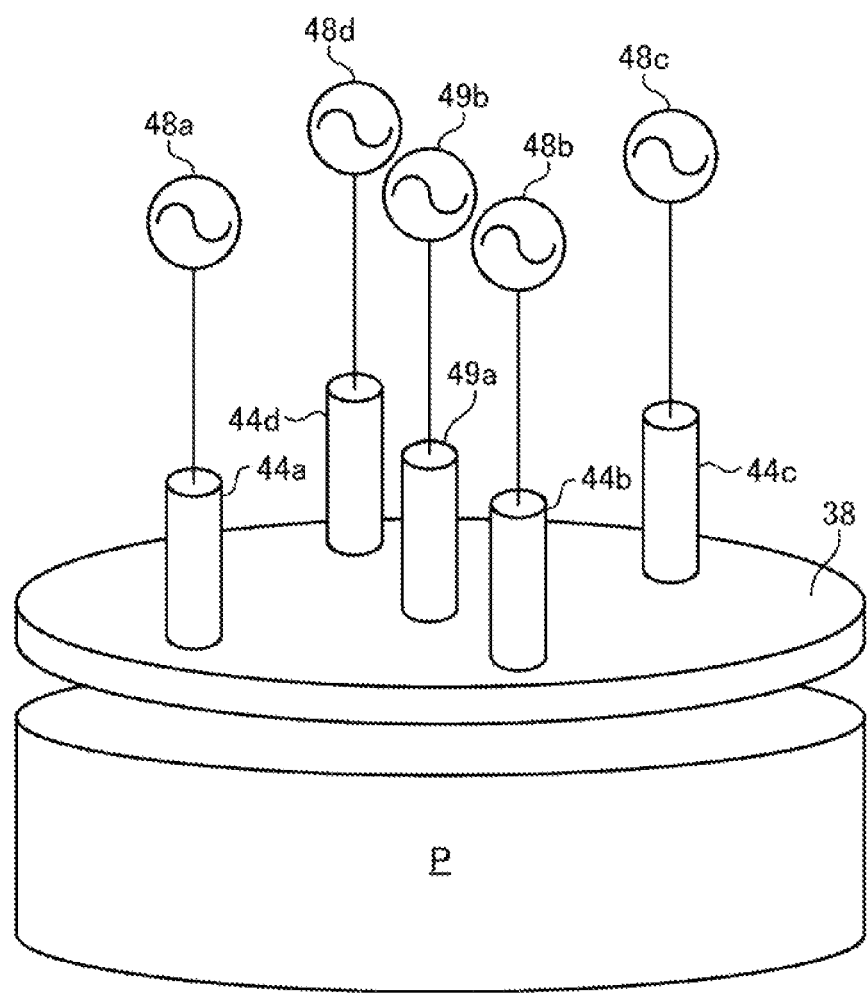
FIG. 21 is a view illustrating an example of a connection of a high-frequency power supply and a power feeding portion to an upper electrode in a seventh modified example.

Next, a modified example in which a power feeding portion is also added to a central portion in addition to the outer peripheral portion of the electrode will be described as seventh and eighth modified examples. FIG. 21 is a view illustrating an example of the connection of the high-frequency power supply and the power feeding portion to the upper electrode in a seventh modified example. In FIG. 21, a power feeding portion 49a is installed on a central portion of the base member 38 in addition to the power feeding portions 44a to 44d located on an outer peripheral portion of the base member 38 of the shower head 34 which is the upper electrode. A high-frequency power supply 49b is connected to the power feeding portion 49a in the same manner as the high-frequency power supplies 48a to 48d respectively connected to the power feeding portions 44a to 44d. In addition, the matching unit is omitted. Although not shown in the drawing, in the base member 38, regions respectively corresponding to the power feeding portions 44a to 44d and 49a are insulated from each other.

Figure 22:
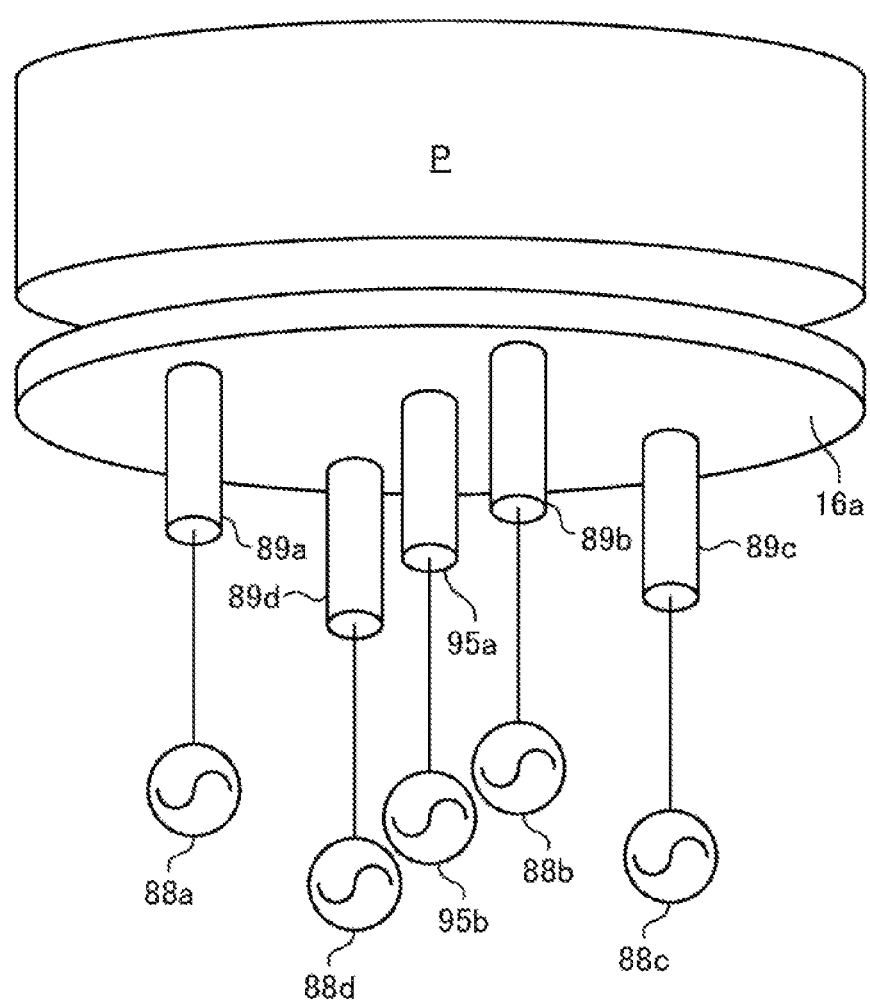
FIG. 22 is a view illustrating an example of a connection of a high-frequency power supply and a power feeding portion to a lower electrode in an eighth modified example.

FIG. 22 is a view illustrating an example of the connection of the high-frequency power supply and the power feeding portion to the lower electrode in an eighth modified example. In FIG. 22, in the case shown in FIG. 3 in which the power feeding portions 89a to 89d are connected to the outer peripheral portion of the mounting table 16a that is the lower electrode, a power feeding portion 95a is further installed on a central portion of the mounting table 16a. A high-frequency power supply 95b is connected to the power feeding portion 95a in the same manner as the high-frequency power supplies 88a to 88d respectively connected to the power feeding portions 89a to 89d. In addition, the matching unit is omitted. Further, although not shown in the drawing, in the mounting table 16a, regions respectively corresponding to the power feeding portions 89a to 89d and 95a are insulated from each other.

Next, a case in which the pulse power feeding to the central portion of the electrode and the pulse power feeding to the outer peripheral portion are combined will be described.

Figure 23:
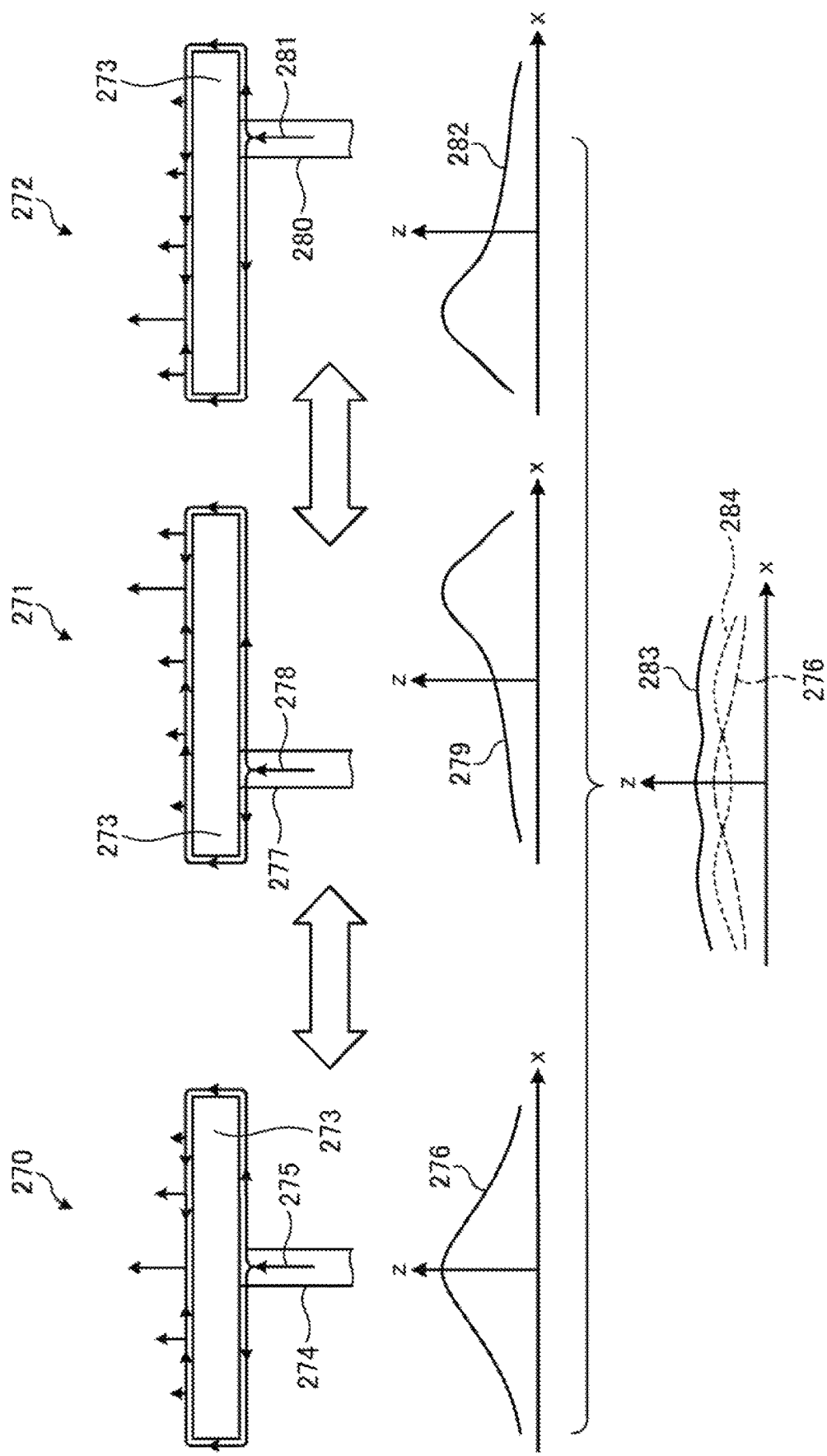
FIG. 23 is a view illustrating an example of a voltage distribution in the case of combining a case of pulse power feeding to the central portion of the electrode and a case of pulse power feeding to the outer peripheral portion of the electrode.

FIG. 23 is a view illustrating an example of a voltage distribution in the case of combining a case of pulse power feeding to the central portion of the electrode and a case of pulse power feeding to the outer peripheral portion of the electrode. Further, in the following description, the description is given with the upper electrode being rotated. In central power feeding state 270 of FIG. 23, RF power 275 is supplied by a power feeding portion 274 connected to a central portion of an upper electrode 273. In this case, as shown in graph 276, a voltage distribution of the upper electrode 273 is high at the central portion of the upper electrode 273 and low at an outer peripheral portion thereof.

In outer peripheral pulse power feeding, state 271 and state 272 are alternately repeated with state 270 therebetween. In addition, in FIG. 23, for convenience of description, a case in which two power feeding portions are located on a straight line is illustrated. In the case of state 271, RF power 278 is supplied by a power feeding portion 277 connected to an outer peripheral portion of the upper electrode 273 on a left side in the drawing. In this case, as shown in graph 279, the voltage distribution of the upper electrode 273 is high at the outer peripheral portion of the upper electrode 273 on a side opposite to the power feeding portion 277 and low at the outer peripheral portion of the upper electrode 273 on a side directly above the power feeding portion 277. Meanwhile, in the case of state 272, RF power 281 is supplied by a power feeding portion 280 connected to the outer peripheral portion of the upper electrode 273 on a right side in the drawing. In this case, as shown in graph 282, the voltage distribution of the upper electrode 273 is high at the outer peripheral portion of the upper electrode 273 on a side opposite to the power feeding portion 280 and low at the outer peripheral portion of the upper electrode 273 on a side directly above the power feeding portion 280.

When the pulse power feeding to the central portion is combined with the pulse power feeding to the outer peripheral portion, the voltage distribution becomes as shown in graph 283. Graph 283 is a graph obtained by further averaging graph 276 of the pulse power feeding to the central portion and graph 284 obtained by averaging states 271 and 272 of the pulse power feeding to the outer peripheral portion. It can be seen that the uniformity of the voltage distribution is further improved in graph 283 including the central portion of the upper electrode.

Figure 24:
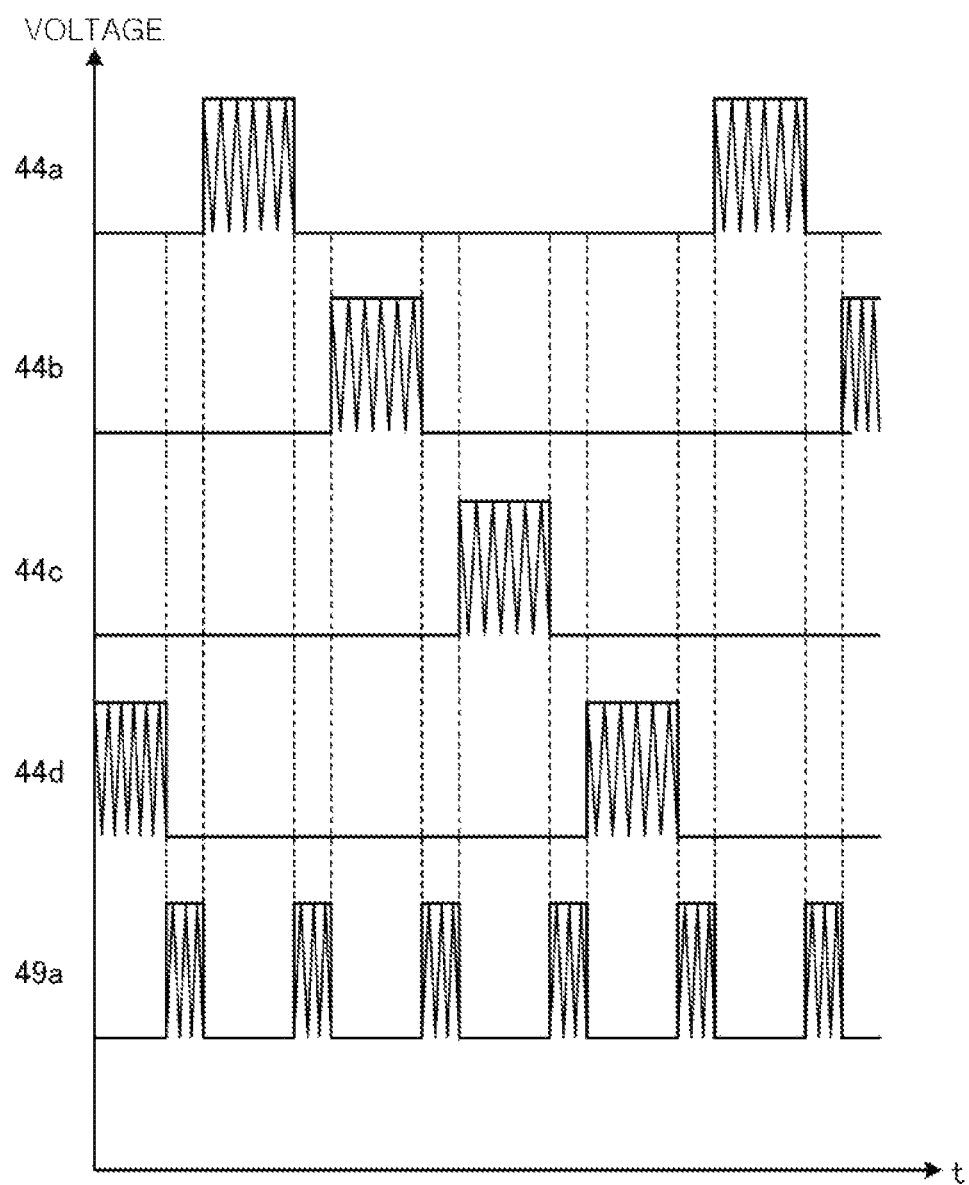
FIG. 24 is a view illustrating an example of an application timing in pulse power feeding in the seventh modified example.
Figure 25:
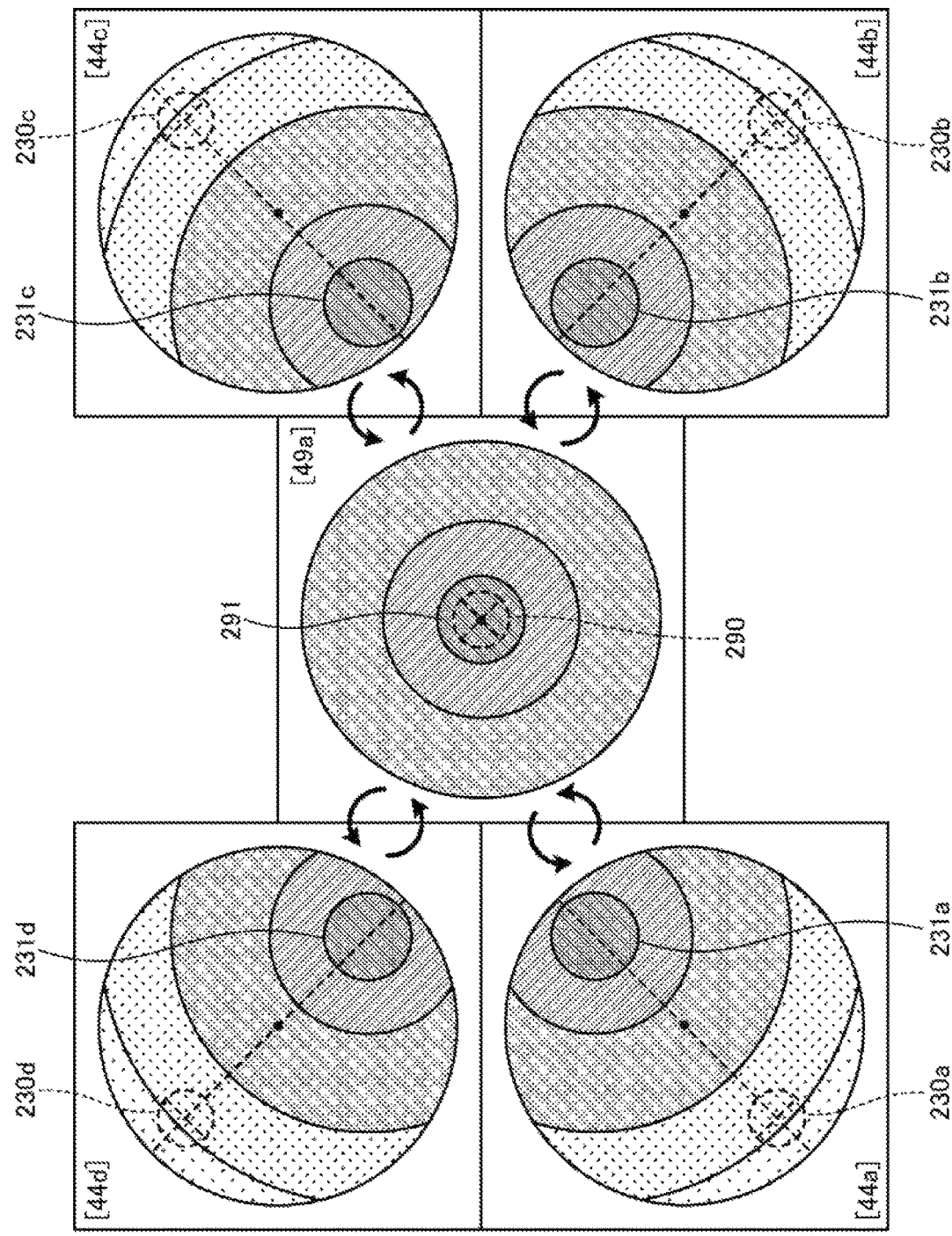
FIG. 25 is a view illustrating an example of a transition of a position at which voltage of the electrode is maximized in the application timing of FIG. 24.

FIG. 24 is a view illustrating an example of an application timing in pulse power feeding in the seventh modified example. FIG. 25 is a view illustrating an example of a transition of a position at which voltage of the electrode is maximized at the application timing of FIG. 24. As shown in FIG. 24, in the seventh modified example, the timing of applying the pulse of RF power to each of the power feeding portions 44a to 44d is shifted, and simultaneously, a pulse of RF power to be applied to the power feeding portion 49a is inserted between the pulses of the power feeding portions 44a to 44d. In the example of FIG. 24, the pulse of RF power is sequentially applied to the power feeding portion 44a, the power feeding portion 49a, the power feeding portion 44b, the power feeding portion 49a, the power feeding portion 44c, the power feeding portion 49a, the power feeding portion 44d, the power feeding portion 49a, the power feeding portion 44a, and the like by shifting the application timing in this order. Then, as shown in FIG. 25, a state in which the voltage distribution is maximized is alternately repeated in the regions 231a to 231d, which are sides opposite to the projected positions 230a to 230d of the power feeding portions 44a to 44d with a center of a circumference of a radius r interposed therebetween, and a region 291 including a projected position 290 of the power feeding portion 49a. That is, the state in which the voltage distribution becomes maximum is moved to the region 231a, the region 291, the region 231b, the region 291, the region 231c, the region 291, the region 231d, the region 291, the region 231a, and the like in this order. Thus, it is possible to control the uniformity of the plasma between the central portion and the outer peripheral portion in accordance with the application time of the RF power at the central portion.

Figure 26:
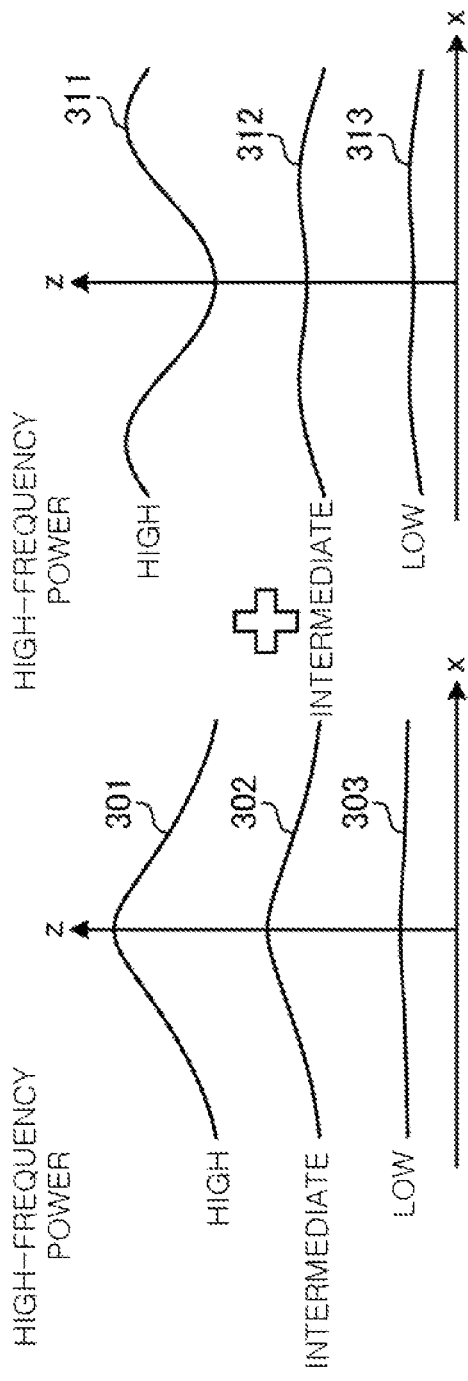
FIG. 26 is a set of graphs illustrating an example of changes in the voltage distribution in the central portion and the outer peripheral portion of the electrode according to an output of the high-frequency power in the seventh and eighth modified examples.

FIG. 26 is a set of graphs illustrating an example of changes in the voltage distribution in the central portion and the outer peripheral portion of the electrode according to an output of the high-frequency power in the seventh and eighth modified examples. As shown in FIG. 26, the higher the output of the high-frequency power (RF power), the greater the change in the voltage distribution. Thus, the combination of the pulse power feeding to the central portion and the pulse power feeding to the outer peripheral portion may control the uniformity of the plasma in any region from the case in which the output of the RF power is low to the case in which the output of the RF power is high. Further, like for a frequency of the RF power, since the change in the voltage distribution is large as the frequency is higher, the uniformity of the plasma may be controlled by combining the pulse power feeding to the central portion with the pulse power feeding to the outer peripheral portion.

Further, for example, when there is a period in which the timing at which the high-frequency power is applied to the power feeding portion 44a overlaps the timing at which the high-frequency power is applied to the power feeding portion 49a, the standing wave from the power feeding portion 44a and the standing wave from the power feeding portion 49a interfere with each other, and thus interference fringes may appear in the voltage distribution on the surface of the upper electrode 273, which may affect the uniformity. Accordingly, as shown in FIG. 24 described above, it is desirable that the timing of applying the high-frequency power to the power feeding portions 44a to 44d and 49a are exclusive as well as periodic.

However, it is expected that, depending on a size of the upper electrode 273 and a mutual distance between the projected positions 230a to 230d and 290 of the power feeding portions 44a to 44d and 49a, the interference fringes may be used to further improve the uniformity of the voltage distribution, and for example, the plasma may be stabilized by providing a period in which the timing of applying the high-frequency power to the power feeding portion 44a overlaps the timing of applying the high-frequency power to the power feeding portion 49a for some time as in the case in which the application of the high-frequency power to the power feeding portion 49a is turned on before the application of the high-frequency power to the power feeding portion 44a is turned off, and thus the application timing of the high-frequency power is not limited to being exclusive.

As mentioned above, according to the present embodiment, a plasma processing apparatus 1 includes a vacuum-exhaustible processing container (chamber 11), an electrode (shower head 34) installed in the processing container, a plurality of power feeding portions 44a to 44d connected to a peripheral portion of a back surface of the electrode, high-frequency power supplies 48a to 48d configured to supply high-frequency power to the electrode respectively through the plurality of power feeding portions, and a control unit (control device 100). The control unit is configured to control the plasma processing apparatus 1 to periodically apply the high-frequency power to each of the plurality of power feeding portions. As a result, plasma having high in-plane uniformity may be generated.

Further, according to the present embodiment, the plurality of power feeding portions are arranged at the same interval on a circumference of the same radius from a center of the electrode on the back surface of the electrode. As a result, plasma having high in-plane uniformity may be generated.

Further, according to the present embodiment, the number of the plurality of power feeding portions is three or more. As a result, plasma having high in-plane uniformity may be generated.

Further, according to the present embodiment, the high-frequency power supply includes a plurality of high-frequency power supplies 48a to 48d that are respectively paired with the plurality of power feeding portions 44a to 44d, and each of the plurality of high-frequency power supplies 48a to 48d is a pulse power supply capable of intermittently outputting high-frequency power. As a result, the timing of applying the high-frequency power to the plurality of power feeding portions 44a to 44d may be controlled.

According to the second modified example, the high-frequency power supply is connected to each of the plurality of power feeding portions 44a to 44d through a plurality of switches 45a to 45d respectively paired with the plurality of power feeding portions 44a to 44d. As a result, the timing of applying the high-frequency power supplied to each of the power feeding portions 44a to 44d from one high-frequency power supply may be controlled.

Further, according to the third modified example, the high-frequency power supply is connected to each of the plurality of power feeding portions 44a to 44d through a plurality of variable capacitors 47a to 47d respectively paired with the plurality of power feeding portions 44a to 44d. As a result, the timing of applying the high-frequency power supplied to each of the power feeding portions 44a to 44d from one high-frequency power supply may be controlled.

According to the present embodiment and the fifth modified example, the control unit applies the high-frequency power to each of the plurality of power feeding portions 44 in an adjacent order in a predetermined circumferential direction. As a result, plasma having high in-plane uniformity may be generated.

Further, according to the sixth modified example, the control unit applies the high-frequency power to each of the plurality of power feeding portions 44 in the order in which diagonal lines of a polygon or diagonal lines and sides of a quadrangle with each of the plurality of power feeding portions 44 as a vertex are drawn in one stroke. As a result, plasma having high in-plane uniformity may be generated.

Further, according to the fourth modified example, the control unit sets the high-frequency power supplied to a specific power feeding portion 44 among the high-frequency power supplied to the plurality of power feeding portions 44 to a value different from that of the high-frequency power supplied to the other power feeding portions 44. As a result, the uniformity of the plasma in the circumferential direction may be adjusted.

Further, according to the seventh and eighth modified examples, central power feeding portions 49a and 95a, which are connected to a central portion of the back surface of the electrode, are further provided, high-frequency power supplies 49b and 95b supply high-frequency power to the electrode respectively through the central power feeding portions, and the control unit is configured to control the plasma processing apparatus 1 to periodically apply the high-frequency power to each of the plurality of power feeding portions 44 and 89 and the central power feeding portions. As a result, it is possible to control the uniformity of the plasma between the central portion and the outer peripheral portion in accordance with an application time of the RF power at the central portion of the electrode.

Further, according to the seventh and eighth modified examples, the high-frequency power supply includes a plurality of high-frequency power supplies 48a to 48d, 49b, 88a to 88d, and 95b respectively paired with the plurality of power feeding portions and the central power feeding portions, and each of the plurality of high-frequency power supplies is a pulse power supply capable of intermittently outputting high-frequency power. As a result, it is possible to control the uniformity of the plasma between the central portion and the outer peripheral portion in accordance with an application time of the RF power at the central portion of the electrode.

Further, according to the second, seventh, and eighth modified examples, the high-frequency power supply is connected to each of the plurality of power feeding portions and the central power feeding portions through a plurality of switches respectively paired with the plurality of power feeding portions and the central power feeding portions. As a result, the timing of applying the high-frequency power supplied to each of the plurality of power feeding portions and the central power feeding portions from one high-frequency power supply may be controlled.

Further, according to the third, seventh, and eighth modified examples, the high-frequency power supply is connected to each of the plurality of power feeding portions and the central power feeding portions through a plurality of variable capacitors respectively paired with the plurality of power feeding portions and the central power feeding portions. As a result, the timing of applying the high-frequency power supplied to each of the plurality of power feeding portions and the central power feeding portions from one high-frequency power supply may be controlled.

Further, according to the seventh modified example, the control unit applies the high-frequency power to each of the plurality of power feeding portions in an adjacent order in a predetermined circumferential direction, and simultaneously, applies the high-frequency power to the central power feeding portion between the application of the high-frequency power to each of the plurality of power feeding portions. As a result, it is possible to control the uniformity of the plasma between the central portion and the outer peripheral portion in accordance with an application time of the RF power at the central portion of the electrode.

According to the seventh modified example, the control unit applies the high-frequency power to each of the plurality of power feeding portions in the order in which diagonal lines of a polygon or diagonal lines and sides of a quadrangle with each of the plurality of power feeding portions as a vertex are drawn in one stroke, and simultaneously, applies the high-frequency power to the central power feeding portion between the application of the high-frequency power to each of the plurality of power feeding portions. As a result, it is possible to control the uniformity of the plasma between the central portion and the outer peripheral portion in accordance with an application time of the RF power at the central portion of the electrode.

Further, according to the fourth and seventh modified examples, the control unit sets the high-frequency power supplied to a specific power feeding portion among the high-frequency power supplied to the plurality of power feeding portions and the central power feeding portions to a value different from that of the high-frequency power supplied to the other power feeding portions. As a result, the uniformity of the plasma in circumferential and radial directions may be adjusted.

Further, according to the present embodiment, the control unit is configured to control the plasma processing apparatus 1 to apply the high-frequency power more exclusively. As a result, plasma having high in-plane uniformity may be generated.

The presently disclosed embodiments are considered in all respects to be illustrative and not restrictive. Further, the above-described embodiments may be omitted, replaced, or changed in various forms without departing from the scope of the appended claims and the gist thereof.

Further, in the above-described embodiments, the space covered by the cover member has been described as being under atmospheric pressure, but the present disclosure is not limited thereto. For example, the space covered by the cover member may be depressurized by a vacuum pump to be in a vacuum state. Thus, even when a chiller refrigerant having a temperature lower than a dew point temperature is used, the occurrence of dew condensation may be suppressed in the space covered by the cover member.

The invention claimed is:

1. A plasma processing apparatus comprising:
a vacuum-exhaustible processing container;
an electrode installed in the processing container;
a plurality of power feeding portions connected to a peripheral portion of a back surface of the electrode;
a high-frequency power supply configured to supply high-frequency power to the electrode through the plurality of power feeding portions; and
a control unit comprising a processor, and a memory with program code that upon execution of the program code by the processor configures the processor to perform control operations;
wherein the control unit is configured to control the plasma processing apparatus to periodically apply the high-frequency power to each of the plurality of power feeding portions, while shifting a timing of applying the high-frequency power to the each of the plurality of power feeding portions, and the control unit applies the high-frequency power to each of the plurality of power feeding portions in an order in which diagonal lines of a polygon or diagonal lines and sides of a quadrangle with each of the plurality of power feeding portions as a vertex are drawn in one stroke.

2. The plasma processing apparatus of claim 1, wherein the plurality of power feeding portions are arranged at the same interval on a circumference of the same radius from a central portion of the electrode on the back surface of the electrode.

3. The plasma processing apparatus of claim 1, wherein the number of the plurality of power feeding portions is three or more.

4. The plasma processing apparatus of claim 1, wherein the high-frequency power supply includes a plurality of high-frequency power supplies that are respectively paired with the plurality of power feeding portions, and each of the plurality of high-frequency power supplies is a pulse power supply that intermittently outputs high-frequency power.

5. The plasma processing apparatus of claim 1, wherein the high-frequency power supply is connected to each of the plurality of power feeding portions through a plurality of switches respectively paired with the plurality of power feeding portions.

6. The plasma processing apparatus of claim 1, wherein the high-frequency power supply is connected to each of the plurality of power feeding portions through a plurality of variable capacitors respectively paired with the plurality of power feeding portions.

7. The plasma processing apparatus of claim 1, wherein the control unit applies the high-frequency power to each of the plurality of power feeding portions in an adjacent order in a predetermined circumferential direction.

8. The plasma processing apparatus of claim 1, wherein the control unit sets the high-frequency power supplied to a specific power feeding portion among the high-frequency power supplied to the plurality of power feeding portions to a value different from that of the high-frequency power supplied to the other power feeding portions.

9. The plasma processing apparatus of claim 1, further comprising a central power feeding portion connected to the central portion of the back surface of the electrode,
wherein the high-frequency power supply supplies the high-frequency power to the electrode through the central power feeding portion, and
the control unit is configured to control the plasma processing apparatus to periodically apply the high-frequency power to each of the plurality of power feeding portions and the central power feeding portion.

10. The plasma processing apparatus of claim 9, wherein the high-frequency power supply includes a plurality of high-frequency power supplies respectively paired with the plurality of power feeding portions and the central power feeding portion, and
each of the plurality of high-frequency power supplies is a pulse power supply that intermittently outputs high-frequency power.

11. The plasma processing apparatus of claim 9, wherein the high-frequency power supply is connected to each of the plurality of power feeding portions and the central power feeding portion through a plurality of switches respectively paired with the plurality of power feeding portions and the central power feeding portion.

12. The plasma processing apparatus of claim 9, wherein the high-frequency power supply is connected to each of the plurality of power feeding portions and the central power feeding portion through a plurality of variable capacitors respectively paired with the plurality of power feeding portions and the central power feeding portion.

13. The plasma processing apparatus of claim 9, wherein the control unit applies the high-frequency power to each of the plurality of power feeding portions in an adjacent order in a predetermined circumferential direction, and simultaneously, applies the high-frequency power to the central power feeding portion between the application of the high-frequency power to each of the plurality of power feeding portions.

14. The plasma processing apparatus of claim 9, wherein the control unit applies the high-frequency power to each of the plurality of power feeding portions in an order in which diagonal lines of a polygon or diagonal lines and sides of a quadrangle with each of the plurality of power feeding portions as a vertex are drawn in one stroke, and simultaneously, applies the high-frequency power to the central power feeding portion between the application of the high-frequency power to each of the plurality of power feeding portions.

15. The plasma processing apparatus of claim 9, wherein the control unit sets the high-frequency power supplied to a specific power feeding portion among the high-frequency power supplied to the plurality of power feeding portions and the central power feeding portion to a value different from that of the high-frequency power supplied to the other power feeding portions.

16. The plasma processing apparatus of claim 1, wherein the control unit is configured to control the plasma processing apparatus to apply the high-frequency power exclusively.

17. A method of applying high-frequency power of a plasma processing apparatus,
wherein the plasma processing apparatus includes
a vacuum-exhaustible processing container,
an electrode installed in the processing container,
a plurality of power feeding portions connected to a peripheral portion of a back surface of the electrode, and
a high-frequency power supply configured to supply high-frequency power to the electrode through the plurality of power feeding portions, and
the method comprises:

a process of periodically applying the high-frequency power to each of the plurality of power feeding portions, while shifting a timing of applying the high-frequency power to the each of the plurality of power feeding portions; and
a process of stopping the application of the high-frequency power,
wherein a control unit, which includes a processor and a memory that stores program code therein that configures the processor to perform control operations upon execution of the program code, applies the high-frequency power to each of the plurality of power feeding portions in an order in which diagonal lines of a polygon or diagonal lines and sides of a quadrangle with each of the plurality of power feeding portions as a vertex are draws in one stroke.

18. The plasma processing apparatus of claim 1, wherein the plurality of power feeding portions are hollow cylindrical members made of a conductive metal.

* * * * *